United States Patent
Gervais et al.

(10) Patent No.: US 9,400,127 B2
(45) Date of Patent: Jul. 26, 2016

(54) METHOD AND SYSTEM FOR MAGNETIC SEMICONDUCTOR SOLID STATE COOLING

(71) Applicant: The Royal Institution for the Advancement of Learning/McGill University, Montreal (CA)

(72) Inventors: Guillaume Gervais, Montreal (CA); Thomas Szkopek, Outremont (CA); Jonathan Guillemette, Outremont (CA)

(73) Assignee: The Royal Institution for the Advancement of Learning/McGill University, Montreal (CA)

( * ) Notice: Subject to any disclaimer, the term of this patent is extended or adjusted under 35 U.S.C. 154(b) by 0 days.

(21) Appl. No.: 14/404,740

(22) PCT Filed: May 30, 2013

(86) PCT No.: PCT/CA2013/000524
§ 371 (c)(1),
(2) Date: Dec. 1, 2014

(87) PCT Pub. No.: WO2013/177678
PCT Pub. Date: Dec. 5, 2013

(65) Prior Publication Data
US 2015/0143817 A1    May 28, 2015

Related U.S. Application Data

(60) Provisional application No. 61/652,931, filed on May 30, 2012.

(51) Int. Cl.
| | |
|---|---|
| *F25B 21/00* | (2006.01) |
| *H01L 23/38* | (2006.01) |
| *H01L 35/28* | (2006.01) |
| *H01L 23/373* | (2006.01) |
| *H01L 23/34* | (2006.01) |

(52) U.S. Cl.
CPC ............... *F25B 21/00* (2013.01); *H01L 23/34* (2013.01); *H01L 23/3738* (2013.01); *H01L 23/38* (2013.01); *H01L 35/28* (2013.01); *F25B 2321/002* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 8,420,236 B2 | 4/2013 | Hosono et al. | |
| 2013/0044787 A1 | 2/2013 | Kirihara et al. | |
| 2013/0104948 A1* | 5/2013 | Saitoh et al. | ................. 136/200 |

OTHER PUBLICATIONS

Wolf, B., Y. Tsui, D. Jaiswal-Nagar, U. Tutsch, A. Honecker, K. Removic-Langer, G. Hofmann, A. Prokofiev, W. Assmus, G. Donath, and M. Lang. "Magnetocaloric Effect and Magnetic Cooling near a Field-induced Quantum-critical Point." Proceedings of the National Academy of Sciences 108.17 (2011): 6862-866.*

*Primary Examiner* — Joseph Schoenholtz
(74) *Attorney, Agent, or Firm* — The Law Office of Michael E. Kondoudis

(57) ABSTRACT

Cryogenic electronics based upon semiconductive devices, superconductive devices, or a combination of the two present opportunities for a wide variety of novel, fast, and low power devices. However, such cryogenic electronics require cooling which is typically achieved through fluid refrigerants such as liquid nitrogen or liquid helium. Solid state refrigeration based upon adiabatic demagnetization in paramagnetic salts offers one alternative but requires that the solid state cooler and cryogenic electronic circuits be different physical elements. The inventors present solid state cooling for semiconductor materials including but not limited to silicon. Beneficially active electronic devices can be integrated monolithically with solid state semiconductor coolers exhibiting magnetic cooling within the whole substrate or predetermined regions of the substrate. Alternatively, active devices may be formed with semiconductor layers integral to them that exhibit magnetic cooling.

20 Claims, 13 Drawing Sheets

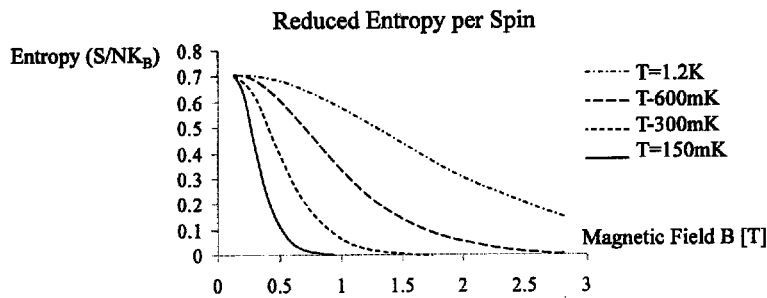
Figure 1A
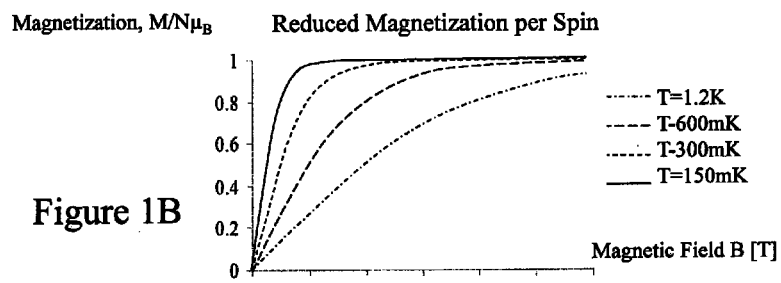
Figure 1B
Figure 2A
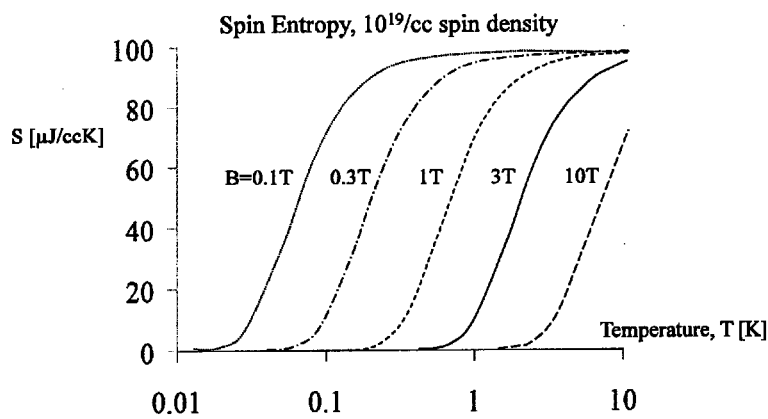

Figure 4
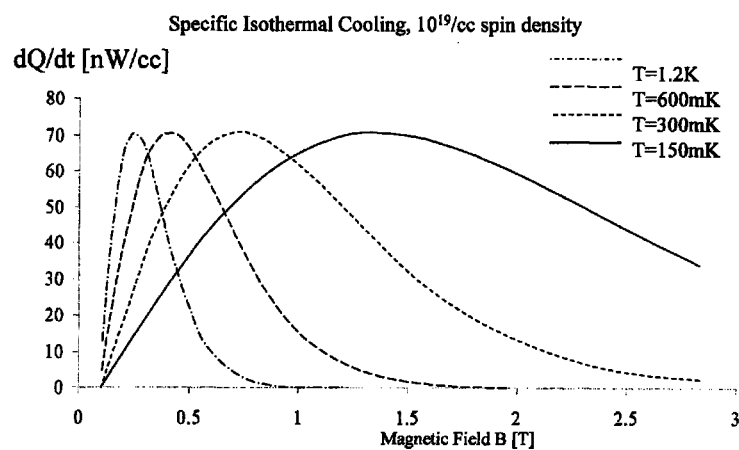
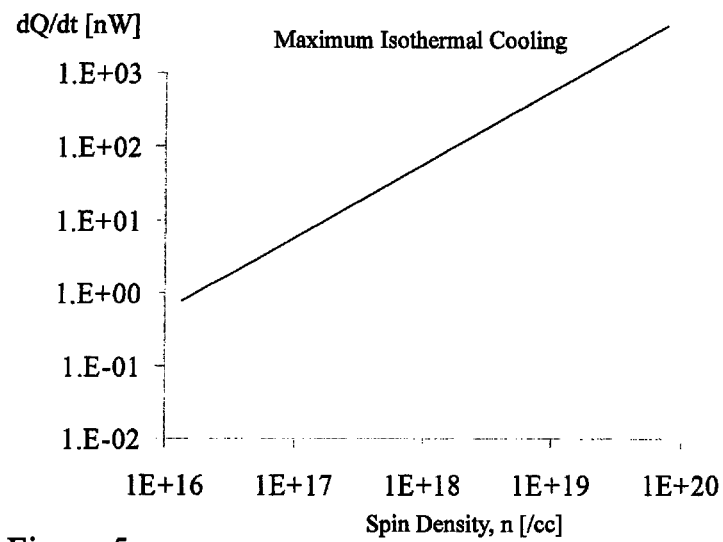
Figure 5

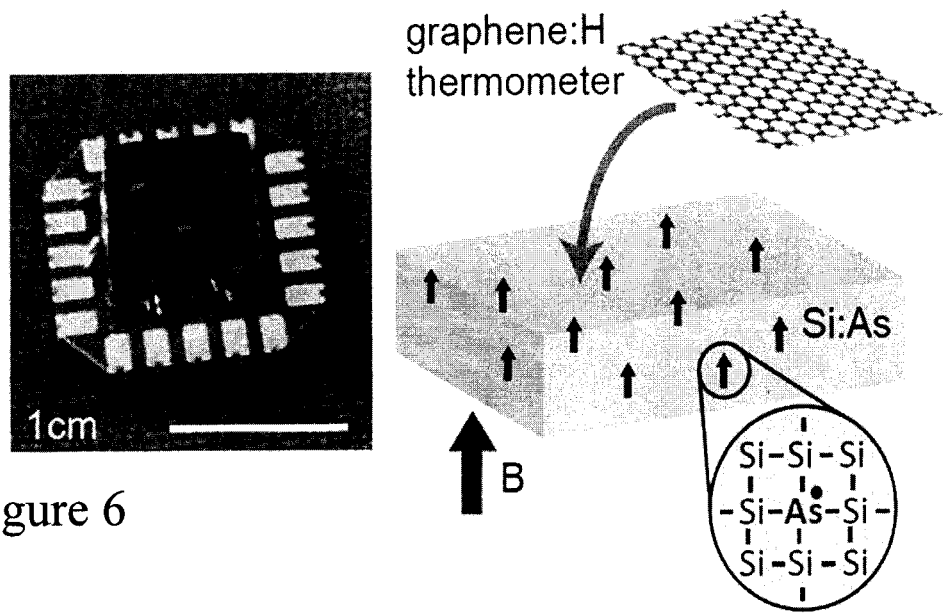
Figure 6
Figure 7
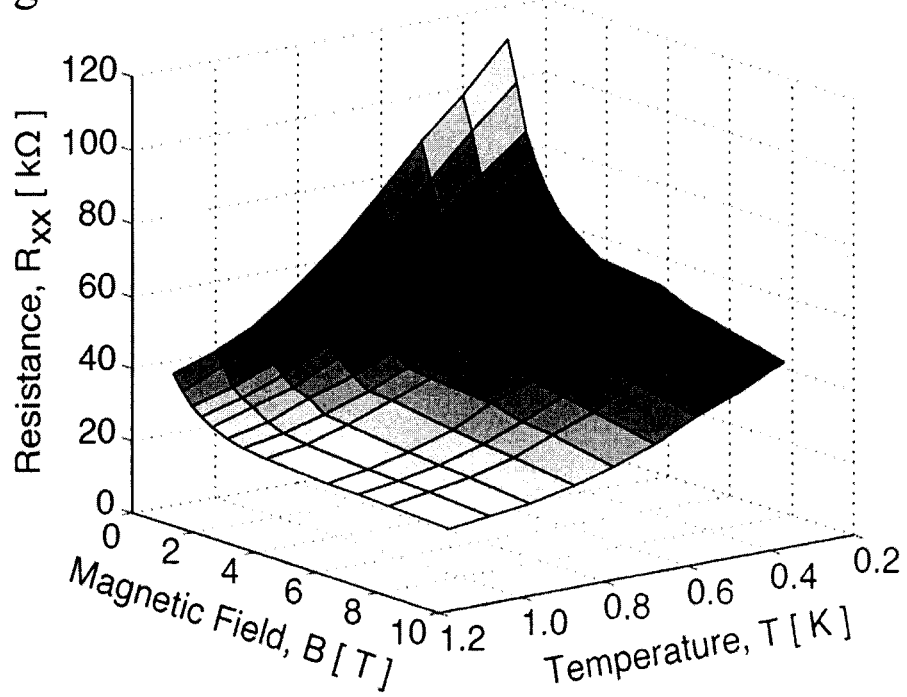

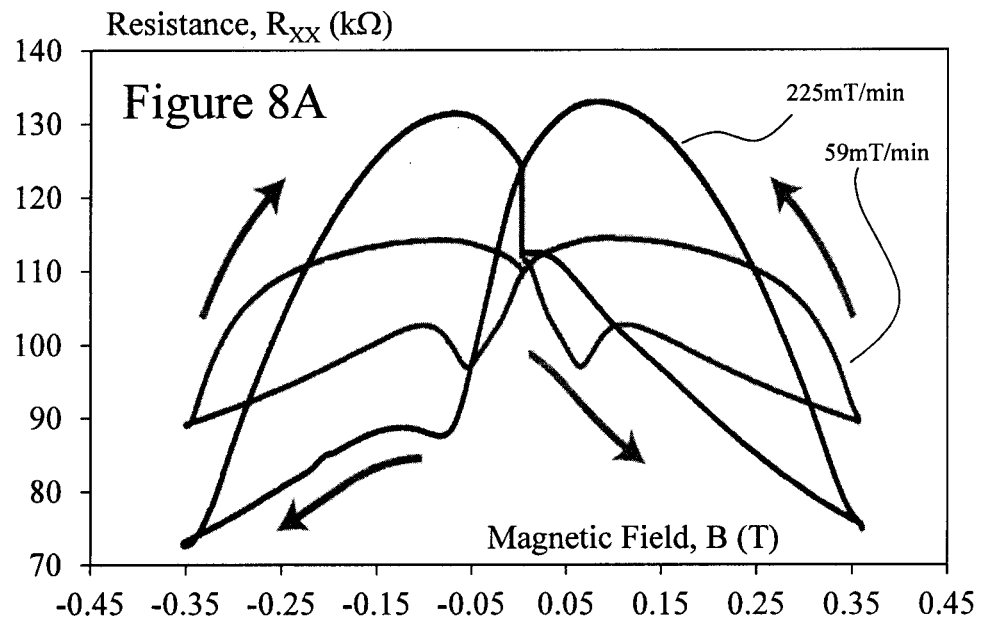
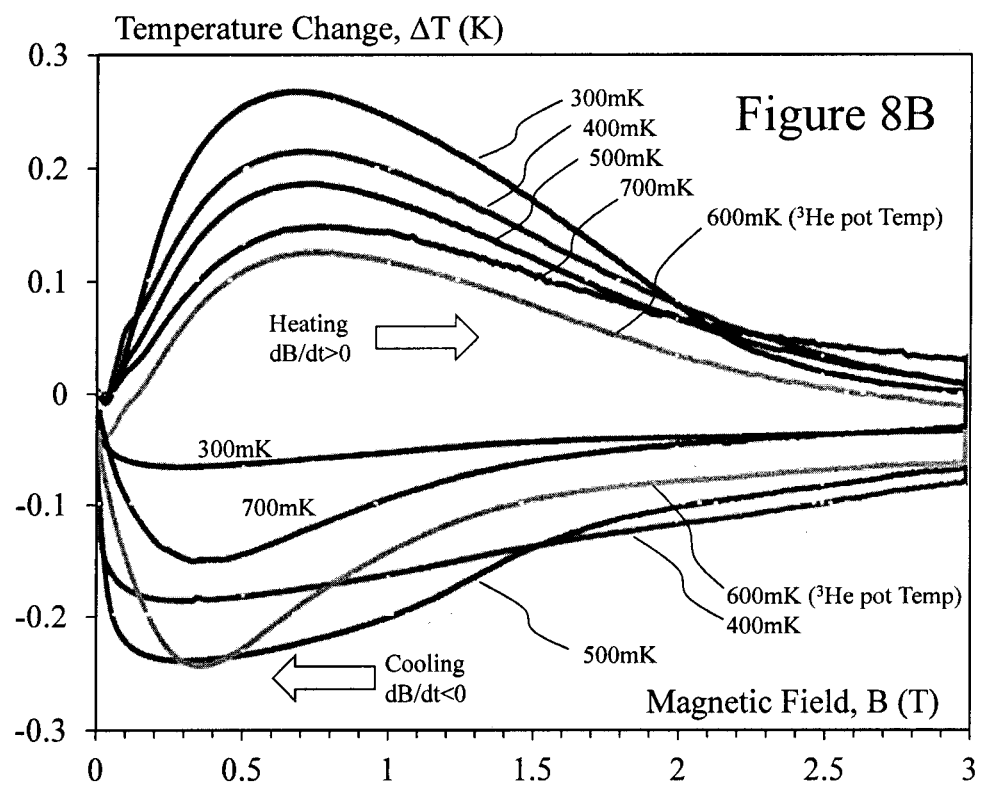

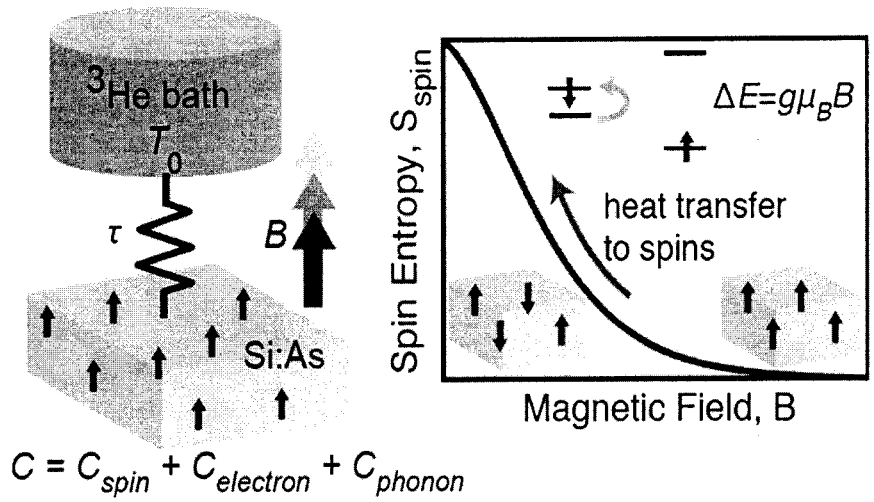
Figure 9A
Figure 9B
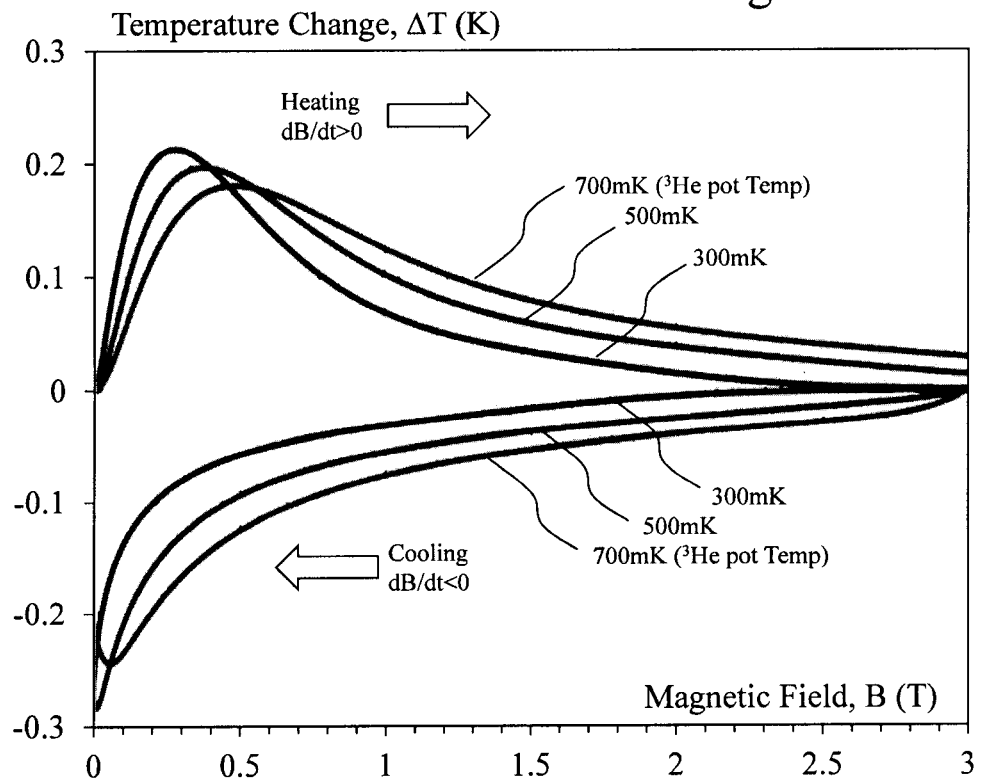

Section X-X

METHOD AND SYSTEM FOR MAGNETIC SEMICONDUCTOR SOLID STATE COOLING

CROSS-REFERENCE TO RELATED APPLICATIONS

This patent application claims the benefit of U.S. Provisional Patent Application U.S. 61/652,931 filed May 30, 2012 entitled "Method and System for Magnetic Semiconductor Solid State Cooling", the entire contents of which are included by reference.

FIELD OF THE INVENTION

The present invention relates to magnetic cooling and more specifically magnetic cooling in semiconductor substrates and devices.

BACKGROUND OF THE INVENTION

In physics, cryogenics is the study of the production of very low temperatures (below −150° C., −238° F. or 123K) and the behavior of materials at those temperatures. Cryogenic electronics, the operation of electronic devices, circuits, and systems at cryogenic temperatures, has been a valuable technology for decades. Cryogenic electronics can be based on semiconductive devices, on superconductive devices, or on a combination of the two. The investigation and application of semiconductor devices, e.g. diodes and transistors, at low temperatures was underway during the 1960s-1970s and has continued such that semiconductor electronics has since expanded into many areas, based on integrated circuits as well as transistors.

Such semiconductor-based cryogenic electronics can be as simple as a circuit using a single transistor (or diode) or as complex as a system incorporating hundreds of large integrated circuits. It includes both analog and digital systems, spans the frequency spectrum from DC to 100 s of GHz, and ranges in power from microwatts to hundreds of watts. Transistors types include both bipolar and field-effect, using Si, Ge, GaAs, SiGe and III-V semiconductor materials. Cryogenic electronic circuits are used not only in the laboratory, but hundreds have been used "in the field" in practical applications, and several types are available commercially. There are two broad reasons for operating electronics at cryogenic temperatures, first being to improve the performance of the electronics (lower noise, higher speed, increased efficiency, etc.), and second because electronics are required to support a sensor, actuator or other apparatus residing in a cryogenic environment. Some applications may combine both reasons. Related benefits of cryogenic operation may include improved thermal and electrical conductivity, lower operating power, reduction of parasitic losses, diminished chemical and metallurgical degradation, and improved overall reliability.

Historically cryogenic electronics have exploited liquid inert refrigerants such as nitrogen (II) oxide (121K), argon (87K), liquid nitrogen (77K), neon (27K), and helium (4K) to provide the required ambient temperature of operation. In some instances thermoelectric coolers, typically Peltier devices, are employed in conjunction with particular refrigerants, such as liquid nitrogen, to obtain intermediate temperatures. However, in all such instances the electronic circuit must be sealed within a housing thermally isolating the electronics from ambient increasing the size, weight and cost of cryogenic electronics. Accordingly it would be beneficial to provide a means of providing cryogenic cooling of electronics with reduced complexity, reduced ancillary hardware requirements, and cost. In other instances it may be beneficial to provide cryogenic cooling to part of an electronic circuit without cooling the entire circuit.

Magnetic refrigeration is a cooling technology based on the magnetocaloric effect which has been used to attain extremely low temperatures, as well as provide cooling over temperature ranges used in common refrigerators, depending on the design of the system. The effect was first observed by Emil Warburg (1880) and the fundamental principle was suggested by Debye (1926) and Giauque (1927) with the first working magnetic refrigerators were constructed by several groups beginning in 1933 and was the first method developed for cooling below approximately 0.3 K which is attainable using $^3$He refrigeration. Using magnetic refrigeration temperatures in the micro-Kelvin ($\mu$K) to milli-Kelvin (mK) ranges.

The mechanism involves a material in which some aspect of disorder of its constituent particles exists at low temperature, for example at liquid helium temperatures of 4K ($^4$He) or 0.3K ($^3$He). Magnetic dipoles in a crystal of paramagnetic salt, e.g. gadolinium sulfate $Gd_2(SO_4)_3.(H_2O)_8$ or cerium magnesium nitrate $Ce_2Mg_3(NO_3)_{12}.(H_2O)_{24}$, have this property of disorder in that the spacing of the energy levels of the magnetic dipoles is small compared with the thermal energy. For paramagnetic salts the active magnetic dipoles are those of the electron shells of the paramagnetic atoms. Under these conditions the dipoles occupy these levels equally, corresponding to being randomly oriented in space. When a magnetic field is applied, these levels become separated sharply; i.e., the corresponding energies are widely different, with the lowest levels occupied by dipoles most closely aligned with the applied field. If the magnetic field is applied while the paramagnetic salt is in contact with the liquid helium heatsink, an isothermal process in which a constant temperature is maintained, many more dipoles will become aligned, with a resultant transfer of thermal energy to the heatsink.

If the magnetic field is decreased after contact with the heatsink has been removed, no heat can flow back in (an adiabatic process), and the paramagnetic salt sample will cool. Such cooling corresponds to the dipoles remaining trapped in the lower energy states, i.e. aligned. Temperatures from 0.3K to as low as 0.0015K have been demonstrated through such paramagnetic salt samples. Much lower temperatures can be attained by an analogous means called adiabatic nuclear demagnetization which relies on ordering (aligning) nuclear dipoles (arising from nuclear spins), which are at least 1,000 times smaller than those of atoms. With this process, temperatures of the ordered nuclei as low as 16 $\mu$K (0.000016K) absolute have been demonstrated.

In both techniques, spins are polarized at an initial high magnetic field $B_i$ at an initial temperature $T_i$, and the magnetic field is then adiabatically swept to a low final field $B_f$. Owing to the adiabatic nature of the magnetic field sweep, the initial spin temperature $T_i$ is reduced to a final spin temperature $T_f = T_i \times (B_f/B_i)$. The electron and phonon degrees of freedom at $T_i$ are subsequently cooled by heat exchange with spins at the lower temperature $T_f$.

Accordingly such solid state refrigeration may be employed to cool an electronic circuit to provide a cryogenic electronic circuit although the same constraints as described supra in respect of cooling the whole electronic circuit remain. Additionally, it is necessary to provide paramagnetic salts in substrate form allowing the electronic circuit, typically formed upon a silicon substrate, to be mounted upon it. It would be beneficial therefore to remove the requirement for such materials by providing direct magnetic cooling of the electronic circuit substrate or a predetermined portion of the electronic circuit and/or electronic circuit substrate. In general form it would be beneficial to be able to provide direct magnetic cooling of semiconductor materials including but not limited to Si, Ge, GaAs, SiGe, InP, AlGaAs, InGaAsP.

According to embodiments of the invention direct cooling of a semiconductor, e.g. silicon, is achieved through demagnetization of electron spins bound to donor impurity atoms. The entropy of donor-bound electron spins in heavily doped silicon, for example, dominates over both phonon entropy and electron gas entropy at low temperatures and moderate magnetic fields, see for example Lakner et al in "Localized Magnetic Moments in Si:P near the Metal-Insulator Transition" (Phys. Rev. B, Vol. 50, pp 17064-17073) and Wagner et al in "Specific Heat of Si:(P,B) at Low Temperatures" (Phys. Rev. B 55, 4219-4224), thus enabling effective cooling by demagnetization. Direct magnetic cooling of silicon substrates as outlined above being of practical importance for silicon device applications in cryogenic electronics requiring low temperatures, including, but not limited to silicon based quantum computing, see for example Maune et al in "Coherent Singlet-Triplet Oscillations in a Silicon-Based Double Quantum Dot" (Nature, Vol. 481, pp 344-347), and transition edge single photon detectors, see for example Lita et al in "Counting Near-Infrared Single-Photons with 95% Efficiency" (Opt. Exp., Vol. 16, pp 3032-3040).

Beneficially active electronic devices can be integrated monolithically atop a semiconductor substrate exhibiting magnetic refrigeration within the whole substrate or predetermined regions of the substrate. Alternatively, active electronic devices may be formed with semiconductor layers integral within them that exhibit magnetic cooling.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to enable magnetic cooling and more specifically magnetic cooling in semiconductor substrates and devices.

In accordance with an embodiment of the invention there is provided a method comprising:
(a) providing a device comprising at least a semiconductor material comprising spins at a predetermined density within a magnetic field;
(b) cycling the magnetic field from a first predetermined value to a second predetermined value at a first predetermined rate to establish a first condition for a predetermined portion of the spins;
(c) extracting thermal energy generated within the semiconductor material through step (b);
(d) increasing the thermal isolation of the semiconductor material to its surroundings; and
(e) cycling the magnetic field from a third predetermined value to a fourth predetermined value at a second predetermined rate to establish a second condition for a predetermined portion of the spins.

In accordance with an embodiment of the invention there is provided a device comprising:
a substrate comprising a first semiconductor material;
an element comprising a second semiconductor material comprising spins at a predetermined density;
an electrically adjustable thermal barrier formed within the substrate between the element and the substrate, wherein the second semiconductor material may be cooled in dependence upon executing a predetermined sequence of steps relating to the electrically adjustable thermal barrier and a variable magnetic field within which the device is located.

In accordance with an embodiment of the invention there is provided a method comprising:
providing a semiconductor heterostructure comprising a spatially varying Landé g-factor from a first predetermined value to a second predetermined value;
applying a predetermined magnetic field to the semiconductor heterostructure;
biasing the semiconductor heterostructure at a voltage that is less than the thermal voltage of the semiconductor heterostructure; wherein
a resulting current flow within the semiconductor heterostructure results in continuous cooling of the side of the semiconductor heterostructure with the Landé g-factor with the first predetermined value.

In accordance with an embodiment of the invention there is provided a device comprising:
a semiconductor heterostructure comprising a spatially varying Landé g-factor from a first predetermined value to a second predetermined value;
a circuit applying a bias to the semiconductor heterostructure at a voltage that is less than the thermal voltage of the semiconductor heterostructure; wherein
a resulting current flow within the semiconductor heterostructure when a predetermined magnetic field is applied results in continuous cooling of the side of the semiconductor heterostructure with the Landé g-factor with the first predetermined value.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 1A and 1B depict reduced entropy and magnetization per spin as a function of temperature and magnetic field;

FIGS. 2A and 2B depict spin entropy and specific versus for different magnetic fields as a function of temperature;

FIG. 4 depicts specific isothermal cooling for a for a Si:As sample according to an embodiment of the invention with varying temperature and magnetic field;

FIG. 5 depicts the maximum isothermal cooling for a Si:As sample according to an embodiment of the invention;

FIG. 6 depicts a Si:As sample with graphene 4-point thermometer according to an embodiment of the invention;

FIG. 7 depicts the resistance versus temperature and magnetic field measured for the graphene thermometer on the Si:As sample according to an embodiment of the invention;

FIG. 8A depicts the measured resistance of the graphene thermometer on the Si:As sample according to an embodiment of the invention at different magnetic field sweep rates;

FIG. 8B depicts the derived temperature change of the Si:As sample according to an embodiment of the invention under magnetic field sweeping at different initial temperatures;

FIG. 9A depicts a simple model for cooling of a semiconductor material according to an embodiment of the invention;

FIG. 9B depicts simulation results for a Si:As sample using the simple model of FIG. 9A;

DETAILED DESCRIPTION

Figure 2B:
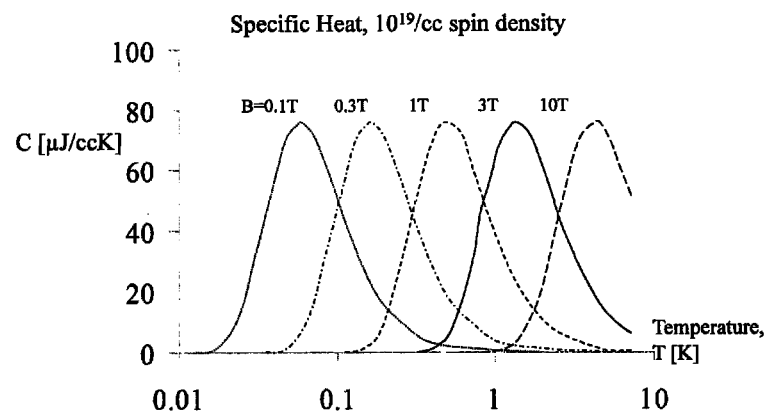

The present invention is directed to magnetic cooling and more specifically magnetic cooling in semiconductor substrates and devices.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

1: Theory: Donor Bound Spin Model for Cooling Semiconductors

Within this section two simple models for cooling/heating via the localized spins on donor bound electrons in a semiconductor, e.g. silicon (Si) are summarised. Whilst the discussions refer to silicon it would be evident that the basic principles apply for donor bound electrons in other semiconductors. The first model is adiabatic demagnetization, where the spins are cooled adiabatically, after which the surrounding matter equilibrates with the spins and an absolute bound on the heat transfer Q is imposed by this model. The second model is isothermal demagnetization, where the spin time constant $T_I$ is so short that spins equilibrate with surrounding matter almost instantaneously during demagnetization. An absolute bound on the rate of heat transfer Q is imposed by this model. Physical embodiments according to embodiments of the invention typically lie somewhere in between these two models.

Within the prior art numerous experiments have been reported on the properties of donor bound electrons (mostly P-doped Si and to a lesser extent As-doped Si), including electron spin resonance, magnetic susceptibility and specific heat measurements. Surprisingly, at doping densities above the metal-insulator transition (MIT), where there is an electron gas present in the Si at low temperatures (4.2K and below), signatures of localized magnetic moments are still observed in magnetic susceptibility and specific heat. According to experimental embodiments of the invention the inventors have employed As-doped Si (also referred to as Si:As) samples having an As doping density estimated to be $10^{20}$/cc based on room temperature sheet resistance, which is above the MIT critical density since conduction persists at T=4.2K. It is noted that at this point in time there is no complete theory for the magnetic properties of donor bound electrons in the presence of an electron gas.

The critical energy scale for antiferromagnetic ordering in the presence of dipole interactions alone determines a lower bound for the temperature and magnetic field at which the spins of donor bound electrons can be considered independent. At $10^{20}$/cc, the average dopant spacing is r=2.15 nm, which corresponds to a dipole-dipole interaction given by Equation (1) below of V=5 neV or $T_C$=63 μK. As such we expect electron spin ordering at ultralow temperatures, although the effect of exchange interactions mediated by free-electrons is expected to increase the critical temperature for spin ordering.

$$V \approx \frac{\mu_0 \mu_B^2}{(4\pi r^3)} \quad (1)$$

1A: Fundamental Properties: The thermodynamic properties of localized electrons with paramagnetic response are well known within the prior art, see for example Pathria in "Statistical Mechanics" (Pergamon Press, ISBN 978-0123821881) and Pobell in "Matter and Methods at Low Temperatures" (Springer Verlag, ISBN 978-3540463566). For N donor bound electron spins with Zeeman energies $\epsilon=\pm g\mu_B B=\pm \mu_B B$, corresponding to a Landé g-factor of g=2 appropriate for a conduction electron in Si, the free-energy A, entropy S, total energy U, magnetization M and heat capacity C are given by Equations (2) to (6) respectively below.

$$A = -Nk_B T \ln\left\{2\cosh\left(\frac{\mu_B B}{k_B T}\right)\right\} \quad (2)$$

$$S = -\left(\frac{\delta A}{\delta t}\right)_B = Nk_B\left[\ln\left\{2\cosh\left(\frac{\mu_B B}{k_B T}\right)\right\} - \frac{\mu_B B}{k_B T}\tanh\left(\frac{\mu_B B}{k_B T}\right)\right] \quad (3)$$

$$U = A + TS = -N\mu_B B \tanh\left(\frac{\mu_B B}{k_B T}\right) \quad (4)$$

$$M = -\left(\frac{\delta A}{\delta B}\right)_T = N\mu_B \tanh\left(\frac{\mu_B B}{k_B T}\right) \quad (5)$$

$$C = \left(\frac{\delta U}{\delta T}\right)_B = Nk_B\left(\frac{\mu_B B}{k_B T}\right)\mathrm{sech}^2\left(\frac{\mu_B B}{k_B T}\right) \quad (6)$$

The reduced entropy per spin, $S/Nk_B$, tends to $\ln 2 = 0.693$ at temperatures high compared to Zeeman energy in an applied magnetic field, i.e. $k_B T > \mu_B B$, as shown in FIG. 1A for different temperatures. The reduced magnetization per spin, $M/N\mu_B$, plotted in FIG. 1B for different temperatures, shows the onset of complete spin polarization with applied field at low temperatures.

1B: Entropy and Heat Capacity: For the purpose of heat exchange, the specific entropy S per cc of Si:As and the specific heat capacity C C per cc of Si:As for a given donor-bound electron density c. Both quantities are in direct proportion to the density of localized magnetic moments of donor-bound electrons, and are plotted in FIGS. 2A and 2B respectively for varying temperature. It has been assumed that 10% of the electrons are bound to the $10^{20}$/cc As dopants. For comparison the total heat capacity of Si:P at 1K was measured by the inventors as $\approx 2-5$ µJ/ccK. Accordingly for 10% donor bound electrons, i.e. $10^{19}$/cc spin density, a 0.05 cc Si sample provides a peak entropy of 4.8 µJ/K and a peak heat capacity of 3.0 µJ/K. It is evident from FIGS. 2A and 2B the peak specific entropy and the peak specific heat are independent of temperature and magnetic field for fixed number of spins. Rather it is the total number of spins that determines the peak entropy and heat capacity of the system overall. The peak heat capacity $C_{peak}$ of a sample with N donor bound electrons occurs at a temperature $T_{peak}$ is given by Equations (7A) and (7B) below.

$$C_{peak} = 0.439 \cdot Nk_B \quad (7A)$$

$$\mu_B B = 1.20 \cdot k_B T_{peak} \quad (7B)$$

1C: Adiabatic Demagnetization and Heat Flow: Adiabatic demagnetization of spins proceeds by ramping a magnetic field from an initial $B_i$ to a final $B_f$ while maintaining constant entropy in the spins. This requires the normalized sweep rate $\dot{B}/B$ to be fast compared to the spin relaxation rate $1/T_1$, but slow compared to resonant frequency $\omega = g\mu_B B/\hbar$. In this classic form of refrigeration by adiabatic demagnetization, the spins are first made cold, after which the lattice equilibrates with the spins. Under adiabatic sweep conditions, the initial spin temperature $T_i$ and final spin temperature $T_f$ are governed by $T_f/T_i = B_f/B_i$. The heat Q that can be absorbed by highly polarized (low entropy) spins cooled to a final temperature $T_f$ at the final magnetic field $B_f$ is given by Equation (8) below.

$$Q = \int_{T_f}^{\infty} T\left(\frac{\delta S}{\delta T}\right)_{B_f} dT = \int_{T_f}^{\infty} CdT \quad (8)$$

where Equation (9) follows from the relation between entropy and heat capacity, $$\left(\frac{\delta S}{\delta T}\right)_B = \frac{C}{T} \quad (9)$$

Assuming that the final spin temperature $T_f$ is much less than the temperature $T_{peak}$ of peak heat capacity, the total heat that can be absorbed by the spins is the area under the C versus T curve given by Equation (10) below. In other words, the maximum heat that can be absorbed by N fully polarized spins is the energy required to flip 50% of the spins at a cost of $g\mu_B B_f$.

$$Q = \int_0^{\infty} CdT = N\mu_B B_f \quad (10)$$

Figure 3:
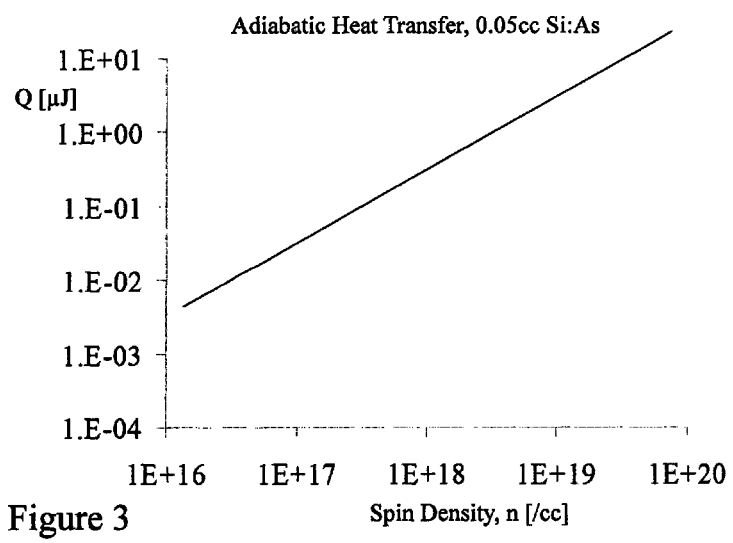
FIG. 3 depicts the adiabatic heat transfer for a Si:As sample according to an embodiment of the invention.

Whether the demagnetization process is adiabatic or not, it is clear that $g\mu_B B_f$ is the absolute maximum heat that can be transferred into the spins. The final magnetic field $B_r$ determines the final spin temperature as $T_f = T_i \cdot B_f/B_i$, and the Si cannot be made any colder. The final magnetic field $B_f$ also sets the total heat Q that can be absorbed, wherefore it is advantageous to use a larger $B_f$ to increase the heat that can be absorbed at the expense of a higher final temperature. The maximum heat that can be absorbed by donor bound electrons in a 0.05 cc Si:As sample at a final field of $B_f = 100$ mT is depicted in FIG. 3.

1D: Demagnetization with Fast Spin-Lattice Relaxation: Non Adiabatic Demagnetization: Adiabatic demagnetization requires no change in spin entropy, and hence no change in spin polarization, during the sweeping of the magnetic field. However, as noted below in respect of experimental results for a Si:As sample with a graphene based four-point resistance probe a significant graphene resistance, and hence temperature, change during the sweep was observed.

The donor bound electron spin longitudinal relaxation time $T_1$ has been studied extensively in Si:P. While most recent work, see for example Tyryshkin et al in "Electron Spin Coherence Exceeding Seconds in High Purity Silicon" (Nat. Mat., Vol. 11, pp 143), has focussed on low-doped Si where $T_1$ can reach 1 hour at 1.2K, the low temperature relaxation time $T_1$ becomes donor density dependent at doping concentrations exceeding $10^{16}$/cc, see for example Feher et al in "Electron Spin Resonance Experiments on Donors in Silicon. II. Electron Spin Relaxation Effects" (Phys. Rev., Vol. 114, pp 1245-1256). For example, at $3 \times 10^{17}$/cc P doping, $T_1$ was measured to be 100 s at T=1.25K and B=320 mT. Little data is available for high doping ranges as electron spin resonance experiments become very difficult at high doping density as the applied microwave fields can induce significant sample heating.

With a very short $T_1$, the donor bound electron spins and lattice are expected to equilibrate almost instantaneously on the time scale of the demagnetization magnetic field sweeps. While the non-adiabatic nature of the demagnetization requires additional experimental testing a simple theory for non-adiabatic cooling was established by the inventors. The simplest case is that of isothermal cooling where it is assumed that the condensed matter to be cooled has a heat capacity large compared to the heat capacity of the donor bound electron spins, and that the spins and surrounding matter equilibrate instantaneously, so that there is a single constant temperature T at which heat flows into the spins during demagnetization.

The isothermal heat flow $\dot{Q}$ from the spins to the environment is given by Equations (11A) and (11B) below. The resulting magnetic field dependence of the rate of heat flow is depicted in FIG. 4 for different temperatures with a magnetic field sweep rate $\dot{B} = -100$ mT/min and the same 10% of electrons bound to the As dopants at a density of $10^{20}$/cc.

$$\dot{Q} = T\dot{S} \quad (11A)$$

$$= T\left(\frac{\delta S}{\delta B}\right)_T \cdot \dot{B}$$

$$= -N\left(\frac{\mu_B B}{k_B T}\right)\mathrm{sech}^2\left(\frac{\mu_B B}{k_B T}\right)\cdot \mu_B \dot{B} \quad (11B)$$

The peak heat exchange rate $\dot{Q}_{peak}$ of a sample with N donor bound electrons occurs at a magnetic field $B_{peak}$ as determined by Equations (12) and (13) below. Within experiments performed to date by the inventors they are not isothermal as warming is observed for $\dot{B}>0$ and cooling observed for $\dot{B}<0$. Consequently, it is anticipated that the magnetic field for peak cooling will be down-shifted from that predicted based upon the initial sample temperature whilst the magnetic field of peak heating will be up-shifted from that anticipated. The maximum rate of isothermal heat absorption by donor bound electrons for a 0.05 cc Si:As sample is plotted in FIG. 5 for a magnetic field sweep rate of $\dot{B}=-100$ mT min.

$$\dot{Q}_{peak} = -0.448 \cdot N\mu_B \dot{B} \quad (12)$$

$$\mu_B \dot{B}_{peak} = 0.772 \cdot k_B T \quad (13)$$

1E: Extensions and Optimization: In this section notes in respect of the above defined simple models for cooling/heating via the localized spins on donor bound electrons in a semiconductor are made with respect to extending and improving the modeling and performance of solid state semiconductor cooling elements prior to the description of experimental results for a 0.05 cc Si:As sample.

1E1: Carrier Density Measurement: At present the exact As doping density nor the percentage of electrons that actually freeze out onto donors at low temperatures are known except from estimates derived from the room temperature resistance of samples tested. Improvements to the data may be made for example by measuring the sheet resistance and Hall resistance at room temperature and at low temperature. At room temperature, the electron density $n_{free}(300K)$ will be very closely equal to the As dopant density $N_D$. At low temperature, the measured free electron density and the donor bound electron density satisfy $n_{free}(0.3K)+n_{bound}(0.3K)=N_D$, allowing an inference of the donor bound density to be made. A semiconductor sample cleaved into a long bar to resemble a Hall bar would be a good candidate for these measurements.

1E2: Optimizing the Cooling and Testing for Adiabatic Behaviour: If adiabatic demagnetization is the mechanism for the cooling, the optimal cooling strategy is to stop the sweep at a final field $B_f$ other than 0 T. With adiabatic cooling then cooling should continue after the sweep has stopped at a $B_f \neq 0$ T. However, if it does not then it is anticipated that the cooling is not adiabatic, i.e. spins are flipping during the B sweep, although it is important in such instances to ensure that delays in temperature measurements are not the root cause. Within the experiments presented below this is not anticipated as the graphene thermometer employed has a very low heat capacity and had a large contact area to the sample.

1E3: Dopant Choice, Density and Strategy: Within the analysis and experiments As has been employed for the donor atom. As has a ground state binding energy of 54 meV which is larger than the ground state binding energy of 45 meV for a P donor atom. Accordingly the model suggests the donor bound electron density will be higher for As than for P which is beneficial for magnetic cooling and hence whilst Si:P may be employed as is Si:As a lower cooling efficiency is predicted.

Within the experimentation and modelling the large $10^{20}$/cc As doping density was chosen on the basis of providing maximum Si conductivity at low temperatures. However, the density of donor bound electrons does not necessarily increase with doping density once the metal-insulator threshold (MIT) is crossed. Moreover, excess conduction electrons act as a heat capacity load on the Si lattice which is undesired for cooling, although it improves thermal contact. Accordingly, based upon activities to date improvements in cooling capacity may be anticipated from refinements in the doping density and the doping strategy. For example an improved cooling substrate might be heavily doped Si with deep level donors, or a Si doped with a shallow level donor such as As or P to a concentration just below the metal-insulator threshold.

1E4: Heat Capacity Measurement: Within the above theoretical analysis heat capacity was derived and plotted in FIG. 2B. However, it is important in establishing design processes for semiconductor devices employing integrated semiconductor solid state coolers for correlations between theory and experiment to be made to verify the theoretical design basis. Accordingly, it would be desirable to directly measure the heat capacity of solid state semiconductor coolers. The inventors note that the graphene thermometer employed within the experiments may also be employed to warm the semiconductor by heat $Q=P\cdot \Delta t$ by applying a known Joule heating power P for a given time $\Delta t$. If the temperature rise $\Delta T$, which may be inferred from the calibrated graphene thermometer resistance without reconfiguring the assembly, is measured at different magnetic fields, the effective heat capacity C(B,T) of the entire system can be measured. It would be important to keep the temperature rise $\Delta T$ small compared to the temperature width of the specific heat as it is only spin heat capacity that is strongly B dependent, an absolute measure of the heat capacity associated under such a scenario with spin can be made.

1E5: Increasing Cooling Power with the Same Material: Within the descriptions of the semiconductor based solid state coolers within the above theoretical analysis and following experimental results and applications overview primary consideration is given to structures with a single semiconductor based solid state coolers. However, it would be possible to increase the overall cooling power by adding additional semiconductor based solid state coolers. For example stacking Si substrates with good contact may be envisaged to achieve such increased cooling power. One such approach for assembly being to exploit anodic bonding which makes use of a thin oxide layer to provide very good contacts between Si wafer pieces. Alternatively a semiconductor die with an integrated solid state semiconductor cooler may be assembled onto another semiconductor carrier or stack of carriers. In some instances it may be beneficial to adjust the physical dimensions of the elements within the stack. It would also be evident that such a stacked design approach also allows design tradeoffs to be performed wherein doping ranges providing high cooling may be incompatible with the semiconductor electronics such that cooling may be partitioned in different weightings between semiconductor substrates with semiconductor electronics and those without.

2. Experiment: Donor Bound Spin Cooled Semiconductors

2A: Sample: The semiconductor employed within the experiments presented below was an As-doped Si sample of dimensions 500 µm×1 cm×1 cm with $1 \leq \rho \leq 5$ mΩ resistivity at room temperature, as depicted in FIG. 6. The As doping density inferred from the room temperature resistivity was $n_{As} > 1.4 \times 10^{19}/cm^3$, see Newman et al in "A Calibration Curve for Room-Temperature Resistivity versus Donor Atom Concentration in Si:As" (Appl. Phys. Lett., Vol. 58, pp 3779), corresponding to a density well-above the critical density of $7.8\times10^{18}/cm^3$ for metal-insulator transition in Si:As, see for example Newman et al "Metal-Insulator Transition in Si: As" (Phys. Rev. B, Vol. 28, pp 638-640). It would be evident that under these conditions an electron gas is present within the Si:As sample thereby allowing for rapid exchange of entropy and heat between the donor-bound spins and other degrees of freedom. The donor bound electron spin longitudinal relaxation time $T_l$ has been studied extensively in Si:P. In weakly doped Si Tl can reach 1 hour at 1.2K, see for example Tyryshkin, and becomes donor density dependent at doping concentrations exceeding $10^{16}/cc$, dropping to 100 µs at $3\times10^{17}/cc$ P doping and T=1.25K, see for example Feher.

In order to measure temperature the 4-point resistance of a large-area, hydrogenated graphene sheet affixed to the silicon was employed as a thermometer with anticipated negligible heat capacity and negligible thermal lag. Monolayer graphene was grown by chemical vapour de-position on copper, see Guermoune et al in " " (Carbon, Vol. 49, pp 4204) wherein, prior to graphene transfer to the Si, a dry thermal oxide of 300 nm thickness was grown on the Si sample for electrical insulation and high thermal conductance to the graphene deposited above. To impart sensitivity of the graphene 4-point resistor at low temperatures, the graphene was weakly hydrogenated, see for example Elias et al in " " (Science, Vol. 323, pp 610) with a capillary atomic hydrogen source, see for example Yates in "Experimental Innovations in Surface Science: A Guide to Practical Laboratory Methods and Instruments" (Springer Verlag, ISBN 978-0387983325, 1997). The grapheme resistance was controllably increased by a factor of 7× at room temperature under vacuum. The complete silicon assembly was then mounted in a 300 mK $^3$He refrigerator, and the 4-point resistance measured using standard lock-in amplifier techniques.

The hydrogenated graphene thermometer was first calibrated against temperature and magnetic field, using a ruthenium oxide thermometer, as shown in FIG. 7. The graphene 4-point resistance $R_{xx}$ was then fit to the form given by Equation (14) below where the coefficients $\alpha_{m,n}$ for m, n≤4 were determined by a least-squares fit over the ranges 0.3K≤T≤1.2K and 0 T≤B≤9 T. Accordingly, in subsequent experiments, the graphene 4-point resistance and magnetic field were used to interpolate temperatures T≥300 mK, and to extrapolate temperatures T≤300 mK. The maximum deviation between interpolated temperature and measured temperature was found to be approximately 15 mK.

2B: Measurements and Analysis: To achieve magnetic cooling, the magnetic field was swept at a fixed rate ±dB/dT, while the hydrogenated graphene 4-point resistance $R_{xx}$ was measured during the sweep by AC lock-in measurements at 19 Hz. A typical response is shown in FIGS. 8A and 8B where the hysteresis window clearly opens with increased sweep rate dB/dT.

Referring to FIG. 8A the 4-point resistance $R_{xx}$ for the graphene versus magnetic field is depicted for magnetic field sweep rates of dB/dT=±225 mT/min and dB/dT=±59 mT/min with an initial $T_0$ established by $^3$He as $T_0$=300 mK. Clearly evident in FIG. 8A is the "butterfly" hysteresis of resistance with magnetic field whose symmetry follows that of heating/cooling by magnetization/demagnetization. Kinks within the measured data at ±75 mT were attributed to a superconducting transition in the Pb/Sn solder used in the electrical leads to the graphene 4-point resistance thermometer. Using the calibration data for the graphene $R_{xx}$(T,B) the temperature change ΔT=T−T$_0$ was inferred during magnetization and demagnetization sweeps at dB/dT=±225 mT/min out to magnetic fields B>3 T and presented in FIG. 8B. The cooling curves are seen to change shape at temperatures T<400 mK.

The symmetry of the measured variation in R in FIG. 8A with B allows us to rule out inductive effects, and attribute the changes in $R_{xx}$ to temperature changes in the Si:As semiconductor arising from the magnetization/demagnetization process. Induction would produce a voltage determined by the sign of dB/dt, and is independent of B, producing a response independent of B. In contrast, magnetic heating or cooling is determined by the sign of d|B|/dt, reversing as B passes through 0 T in agreement with the measured $R_{xx}$.

As evident in FIG. 8B sweeping dB/dt>0 from B=0 results in heating of the Si:As semiconductor being observed. The donor-bound spins are brought from a high entropy state to a low entropy state by the applied magnetic field. As the spins are being polarized, every relaxation of a donor bound spin into the ground state releases $g\mu_B B$ energy into the Si lattice as heat. On the other hand, cooling is observed when sweeping dB/dt<0 from B>3 T. The donor-bound spins are brought from a low entropy state to a high entropy state, with each spin flip into an excited state taking $g\mu_B B$ energy from the Si lattice to produce an overall cooling. The temperature increase upon heating diminishes as the initial Si:As temperature is varied from 300 mK to 700 mK. This trend is anticipated from the increase in electron and phonon contributions to heat capacity with temperature. The temperature decrease upon cooling does not show a monotonic behaviour with the initial Si:As temperature, and the shape of the cooling curve itself depends upon the initial Si:As temperature.

To further understand the experimentally observed heating and cooling curves with a swept magnetic field, a simple numerical model was constructed as shown in FIG. 9A. The Si:As heat capacity was assumed to have three contributions $C=C_{spin}+C_{electron}+C_{phonon}$. The phonon contribution $C_{phonon}=1944$ J/molK$^4 \cdot (T/\Theta_D)^3 \cdot (V/V_m)$ where $\Theta$=660K, the Si molar volume $V_m$=12.06 cc and the sample volume V=0.05 cc. The electron contribution $C_{electron}=\gamma \cdot T \cdot V$ where $\gamma=\pi^{2/3} \cdot k_B^2 \cdot DOS(E_F)$, with DOS(E$_F$) being the density of conduction band states at the Fermi level. The electron density was taken to be the As doping density, $n \approx n_{As}=1.4\times10^{19}/cc$. The donor bound electron spin contribution was assumed to be of the Schottky form $C_{spin}=n_S V k_B \cdot (g\mu_B B/2k_B T)^2 \cdot sech^2(g\mu_B B/2k_B T)$, where the spin density $n_S$ was estimated. At doping densities above the critical density for the metal insulator transition, the donor bound spin density $n_S$ is substantially less than the dopant density. A reasonable approximation of spin density for good agreement between experiment and theory was found in this instance to be $n_S$=5×10$^{18}$/cc.

The temperature of the Si:As was numerically calculated by integration of the differential Equation (15) below where $T_0$ is the $^3$He substrate temperature and τ is the thermal time constant for heat exchange between Si:As and the $^3$He substrate. The time constant was taken to be τ=40 s, in the range of the measured time constant τ=20–50 s. Owing to the rapid $T_l$ longitudinal relaxation time of donor bound spins, the spins are effectively in thermal equilibrium with the Si lattice and electrons, and a single temperature T can describe the Si:As. The time rate of change of paramagnetic spin entropy $\dot{S}_{spin}$ due to a swept magnetic field $\dot{B}$ is given by Equation (16) below.

$$\dot{T} = \frac{T\dot{S}}{C} = \frac{T-T_0}{\tau} \tag{15}$$

$$\dot{S} = -n_s V \left(\frac{\mu_B B}{k_B T^2}\right) sech^2\left(\frac{\mu_B B}{k_B T}\right) \cdot \mu_B \dot{B} \tag{16}$$

The resulting evolution of the paramagnetic spin entropy and spin magnetization with decreasing magnetic field is shown in FIG. 4B. With the reduction in magnetic field, spin flips are energetically allowed with heat and entropy consequently transferred from the lattice and free electrons to the donor bound spins. The simple paramagnetic spin model for donor bound electrons predicts increasingly effective cooling as the initial Si:As temperature is reduced, as seen in FIG. 4B. In contrast, the experimental demagnetization curves of FIG. 3B show a strong saturation in cooling at T=300 mK.

The temperature limit to magnetic cooling is set by the magnetic ordering temperature $T_C$ of the spins, below which there is negligible entropy associated with the spin degrees of freedom. In the case of conventional paramagnetic salt refrigerants, the ordering temperature is set by dipole-dipole interactions $\sim\mu_B^2/r^3$. In the case of cerium magnesium nitrate (CMN), magnetic ordering of paramagnetic ions at an ~1 nm ion-ion distance limits refrigeration to ~2 mK, see for example Pobell, and further dilution of the ion density enables refrigeration to ~0.9 mK, see for example Koláč et al in "Adiabatic Demagnetization of Diluted Cerium Magnesium Nitrate" (J. Low Temp. Phys., Vol. 11, pp 297-). A semiconductor doped above the critical density for a metal-insulator transition, such as the Si:As solid state cooler within these experiments, exhibits magnetic ordering through exchange interactions mediated by unbound electrons that elevate the ordering temperature $T_C$. Heat-capacity measurements of heavily doped Si have verified the importance of exchange interactions in the metallic doping regime.

Importantly, paramagnetic spin density is not a monotonic function of doping density, see Lakner and Wagner, indicating that the base temperature and cooling power of a doped semiconductor magnetic cooler is non-trivially dependent upon doping density. Accordingly, the cooling power $T\dot{S}_{spin}$, ordering temperature $T_C$ and thermal conductivity of the heavily doped silicon are all tunable with doping density.

Accordingly, solid state semiconductor coolers according to embodiments of the invention may be considered as providing a replacement for ³He which is a resource of finite and very limited availability with a significant cost associated with it. In contrast, silicon, is an abundant material providing non-consumable use within ultra-low refrigeration and cooling applications.

As discussed above the solid state semiconductor cooling may be applied to a variety of semiconductor materials and semiconductor coolers may be combined for increased cooling capacity. Beneficially solid state semiconductor coolers may be:

- directly integrated to semiconductor substrates to cool all or a predetermined portion of the cryogenic electronics formed thereupon;
- directly integrated with existing cryofree technologies circumventing the use of any helium at all;
- have no moving parts providing increased reliability and lifetime;
- negligible preventative maintenance in discrete cooler applications;
- are very easy to use and integrate into cryogenic electronics;
- directly cool monolithically integrated devices and/or systems;
- fully compatible with semiconductor fabrication technologies; and
- have marginal cost for integrating the technology into any semiconductor electronic circuit.

3. Non-Donor Spin Cooled Semiconductors

Within the preceding section adiabatic demagnetization and cooling of a semiconductor employed donor-bound spin within the semiconductor. However, electron spin may be bound through other effects including, but not limited to, defects and antisite defects. Accordingly, a semiconductor substrate or portion of a semiconductor circuit with sufficiently high defect density provide spin binding sites such that the adiabatic demagnetization and cooling may be produced in non-doped semiconductors as well as doped semiconductors.

4. Solid State Semiconductor Cooler Applications

As discussed supra solid state semiconductor coolers may be directly integrated into a variety of cryogenic electronic devices and circuits. However, they may also be integrated into a variety of cryogenic photonic and opto-electronic devices. Referring to FIGS. 10 through 18 examples of devices, circuits, topologies, topographies, and applications of solid state semiconductor cooling are presented.

Figure 10:
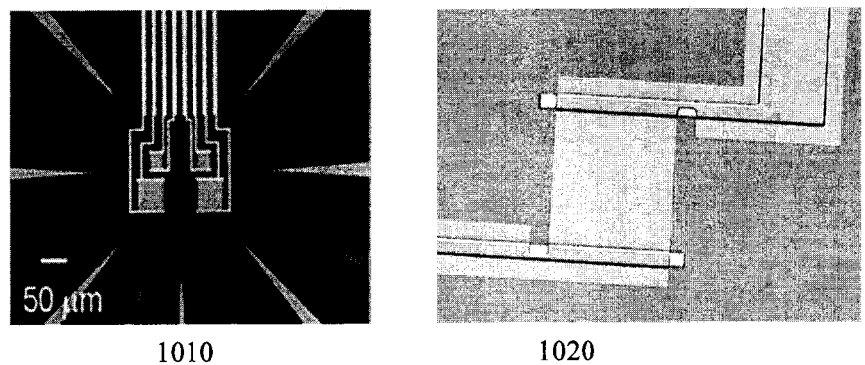
FIG. 10 depicts transition edge sensors which may be implemented onto solid state coolers exploiting semiconductor materials according to embodiments of the invention.

FIG. 10 depicts first and second transition edge sensors (TES) 1010 and 1020 which are superconducting devices capable of counting individual photons in optical pulses with accuracy limited primarily by the quantum noise of the laser source. Each of the first and second TES 1010 and 1020 consists of a thin layer, ~20 nm, of superconducting material, typically tungsten, placed on an insulating substrate, generally silicon. In operation each of the first and second TES 1010 and 1020 is cooled to below the critical temperature of the superconducting film and a small voltage applied across the film, so that it has a slight electrical resistance and is in the middle of its superconducting transition region. Accordingly an incident photon deposits energy into the TES, heating the superconducting film and raising its resistance such that the photons can be detected and "counted" based upon the resistance change. According to embodiments of the invention first and second TES 1010 and 1020 would be formed upon a substrate 1030 with an insulating layer 1040 atop which the thin tungsten 1050 and interconnect metallization 1060 are formed. According to the solid state semiconductor substrate 1030 may be doped or undoped wherein the insulating layer 1040 may for example be thin oxide in the instance of a doped silicon substrate 1030 or an intrinsic layer wherein the semiconductor substrate is undoped but has defect bound spins. Other variants and alternatives would be evident to one skilled in the art.

Figure 11:
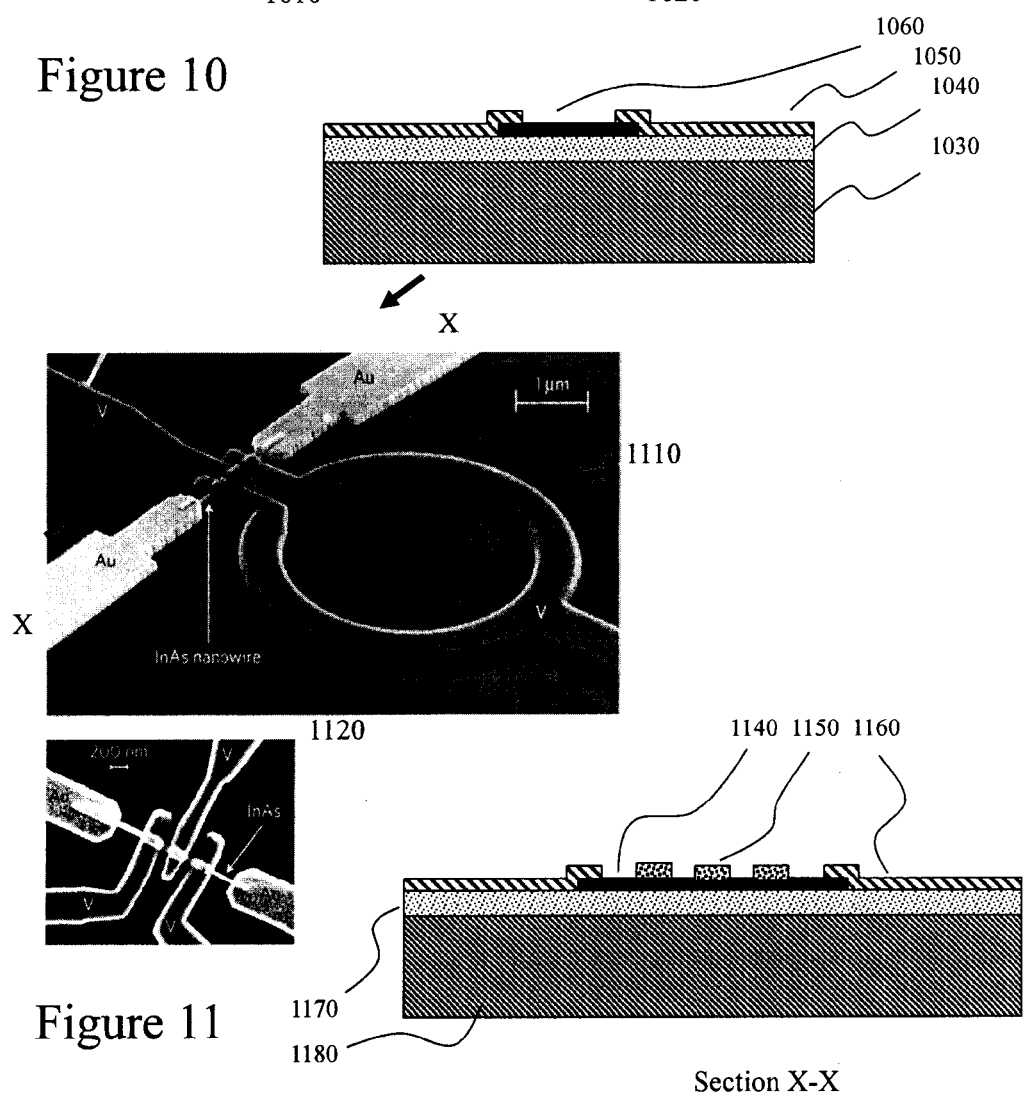
FIG. 11 depicts an AC Josephson superconducting junction which forms part of hybrid normal-conducting device with an unbiased InAs nanowire integrable with solid state cooling methodologies according to embodiments of the invention.

Optionally, the TES detectors may be formed in an array and read with a multiplexer based upon superconducting quantum interference device (SQUID) such as taught by Chervenak et al in "Superconducting Multiplexer for Arrays of Transition Edge Sensors" (Appl. Phys. Lett, Vol. 74, pp 4043-4045). Such SQUID devices, strictly DC SQUIDs, exploit two Josephson junctions in parallel within a superconducting loop. Referring to FIG. 11 there is depicted an AC Josephson superconducting junction which forms part of hybrid normal-conducting device with an unbiased InAs nanowire as depicted in pseudo-colour scanning electron micrograph (SEM) 1110 and SEM image 1120.

As depicted in cross-section X-X the InAs nanowire (NW) 1140 is connected to three ≈250-nm-wide vanadium/titanium (V/Ti) superconducting contacts 1150 thereby forming two ≈50-nm-long Josephson weak-links. Each end of the InAs NW 1140 is connected to gold contacts 1160 and the entire device sits upon a substrate 1170 with an insulating layer 1180 between the substrate 1170 and hybrid normal-conducting device in the instances that the substrate 1170 is conducting. Accordingly localized solid state cooling may be applied by the substrate 1170 to the hybrid normal-conducting device or alternatively localized heating may be applied from the insulating layer 1180 in other embodiments of the invention.

Figure 12:
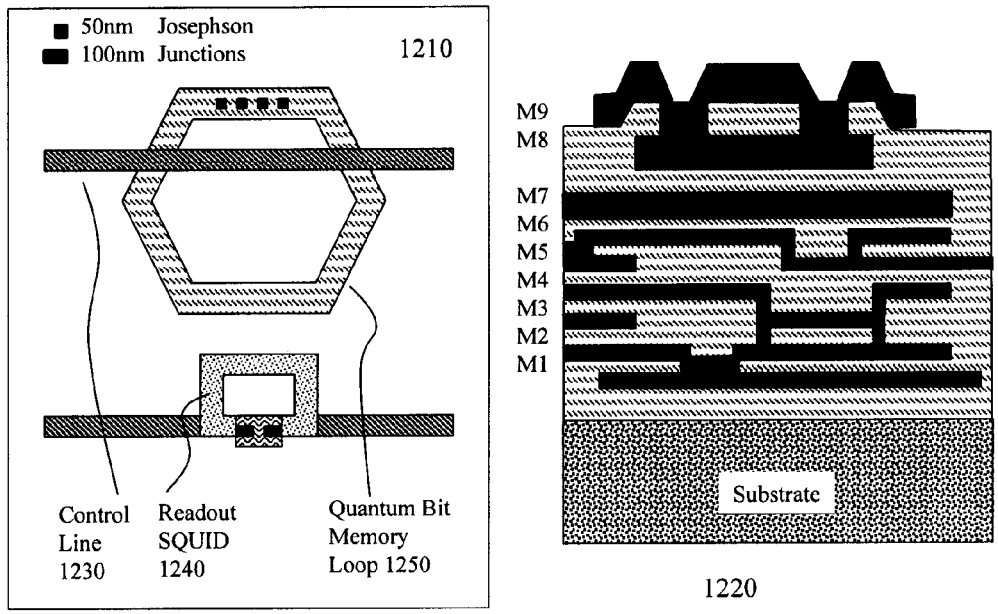
FIG. 12 depicts a Josephson Junction based quantum-bit memory and metallization interconnect integrable with solid state cooling methodologies according to embodiments of the invention.

Referring to FIG. 12 there are depicted a quantum bit memory cell 1210 and superconducting interconnection structure 1220. Quantum bit memory cell 1210 operates based upon rapid super-flux quantum (SFQ) technology wherein digital data is carried by magnetic flux quanta are produced by Josephson junctions instead of transistors in semiconductor electronics and wherein the magnetic flux quanta are carried by picosecond-duration voltage pulses that travel on superconducting transmission lines, instead of static voltage levels in semiconductor electronics. Accordingly quantum bit memory cell consists of a quantum bit memory loop (Qu-bit) 1250 comprising 50 nm Josephson Junctions (JJs) which is accessed through a control line 1230. Adjacent to the Qu-bit 1250 is a readout SQUID 1240 comprising a pair of 100 nm JJ devices such that overall a single bit has an area of approximately 4 m square.

A memory array of Qu-bit 1250 devices may be implemented in layers M8 and M9 of a superconducting interconnection structure 1220 for example upon a silicon substrate together with ground plane M7, DC power planes M1 and M2, and first and second passive transmission lines (PTLs) formed within layers M3 through M6. Accordingly as evident from discussions supra in respect of solid state cooling on silicon and other semiconductors it would be evident that such Qu-bit memory devices as well as other Qu-bit circuits may be cooled exploiting embodiments of the invention. Layers M1 through M9 may for example be niobium or another metal providing superconducting behaviour at the operating temperature of the cooler.

Figure 13:
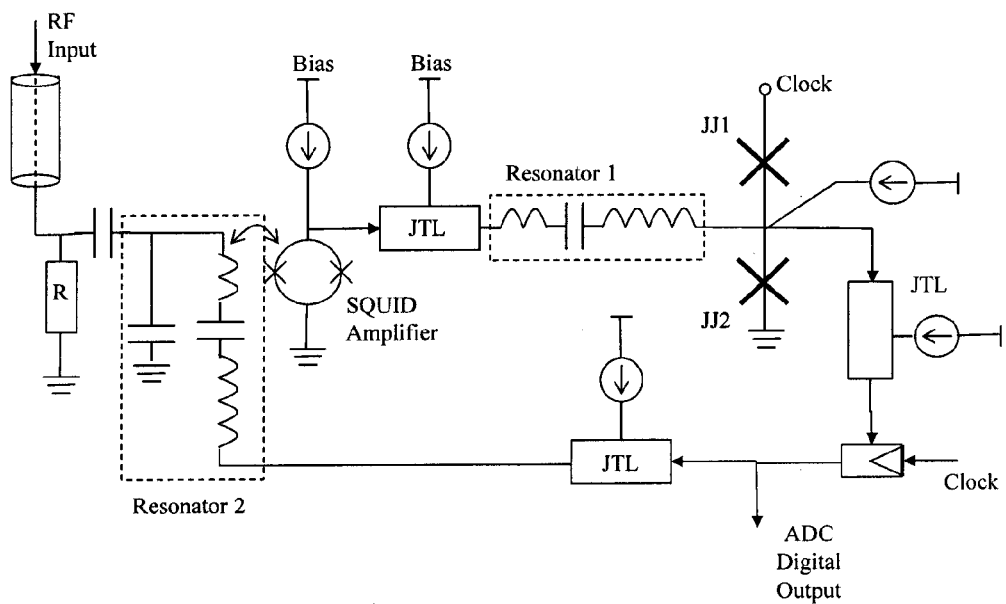
FIG. 13 depicts a $2^{nd}$ order bandpass sigma-delta analog-to-digital converter exploiting superconducting Josephson Junctions and integrable with solid state cooling methodologies according to embodiments of the invention.

Referring to FIG. 13 there is depicted a superconducting $2^{nd}$ order bandpass sigma-delta analog-to-digital converter ($2^{nd}$ ΣΔ ADC) according to Kirichenko in US Patent Application 2010/0,026,537 entitled "Superconductor Analog-to-Digital Converter" wherein a pair of resonators are employed but only the second stage has an explicit feedback loop, the first stage feedback being implicit. The comparator is JJ2 which is clocked through JJ1 such that comparator JJ2 subtracts a single flux quantum from the input while producing a digital output SFQ pulse, and thus, provides for the implicit feedback. The signal to be digitized is being received by the Resonator 2 whilst Resonator 1 feeds into the comparator JJ2 thereby generating SFQ pulses, which are directed to the feedback loop and to the ADC digital output.

The coupling between the two resonators is accomplished through a SQUID amplifier and Josephson transmission line (JTL) so as to provide non-reciprocal, directional, coupling between Resonator 2 and Resonator 1. The SQUID amplifier being inductively coupled to Resonator 2. Accordingly the $2^{nd}$ ΣΔ ADC may exploit a similar stacked metallization and interconnection structure as represented by superconducting interconnection structure 1220 in FIG. 12 and exploit solid state semiconductor cooling as discussed above using doped or undoped semiconductor substrates or thin films.

Figure 14:
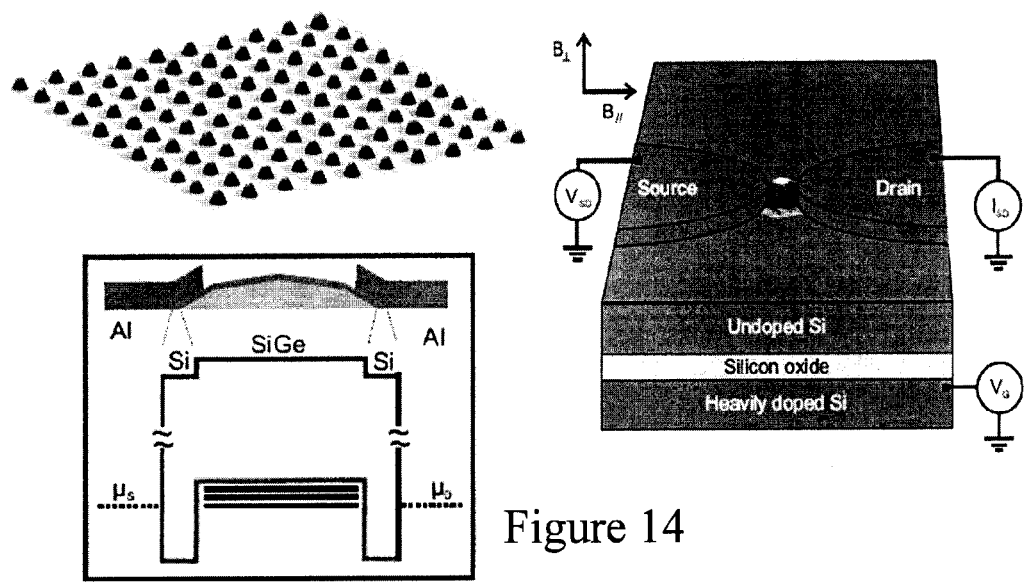
FIG. 14 depicts a self-assembled SiGe nanocrystal within a junction supporting two-dimensional Qu-bit architectures integrable with solid state cooling methodologies according to embodiments of the invention.

Referring to FIG. 14 there is depicted a self-assembled silicon-germanium (SiGe) nanocrystal grown directly on Si by molecular-beam epitaxy via Stranski-Krastanow growth mode. These nanocrystals can have a variety of sizes and shapes and their composition can be controlled to a high degree by adjusting the growth parameters. In addition, their positions can be controlled via pre-patterning of the growth surface. SiGe nanostructures can form ideal contacts with metals, which is essential for making hybrid superconductor-semiconductor devices. As depicted in FIG. 14 the smaller contact area between drain and source electrodes in conjunction with the lower dimensionality of self-assembled SiGe nanocrystals extends gate control of the supercurrent to the single-hole level. Self-assembled SiGe nanocrystals in such configurations may support two-dimensional Qu-bit architectures in quantum information applications as opposed to one-dimensional architectures based on Ge/Si core/shell nanowires for example. As depicted in FIG. 14 the SiGe nanocrystals are formed upon a stack comprising undoped silicon, silicon dioxide, and heavily doped silicon. Accordingly embodiments of the invention provide for solid state cooling to be implemented within the undoped silicon and/or doped silicon substrate portions.

Figure 15:
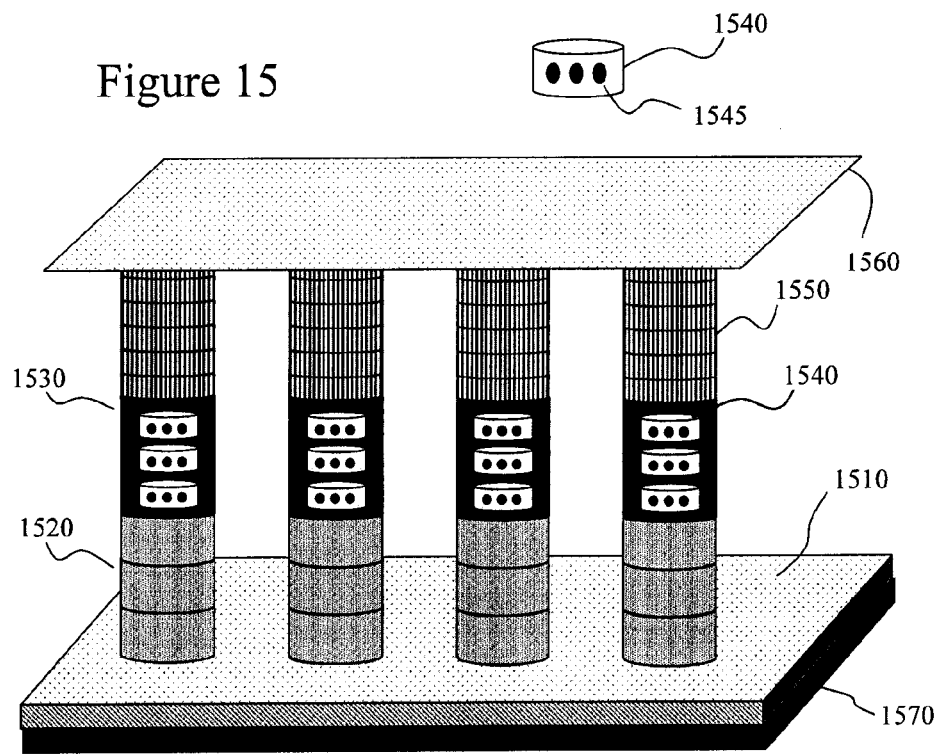
FIG. 15 depicts a dot-within-a-dot-in-a-nanowire structure integrable with solid state cooling methodologies according to embodiments of the invention.

Referring to FIG. 15 there is depicted a dot-within-a-dot-in-a-nanowire light source 1500 comprising a substrate 1510, for example n-type <111> silicon, upon which a GaN buffer 1520 is grown, followed by three vertically aligned large quantum dots 1540 within GaN barrier 1530, and a GaN capping layer 1550. An ITO electrode 1560 is formed on top of the GaN capping layer 1550 to provide the top electrode to the dot-within-a-dot-in-a-nanowire light source 1500. Due to the very high quality, relatively defect free, and uniform growth within the quantum well and quantum dots localized In rich nanoclusters form within each quantum dot as it is grown, thereby forming small quantum dots 1545 within each of the large quantum dots 1540. As depicted the substrate 1510 is formed upon a base 1570 and as discussed supra in respect of embodiments of the invention the substrate 1510 and/or base 1570 may be doped or undoped and provide semiconductor solid state cooling according to embodiments of the invention. It would also be evident that the nanowire may also form part of the overall solid state cooling based upon embodiments of the invention.

Figure 16:
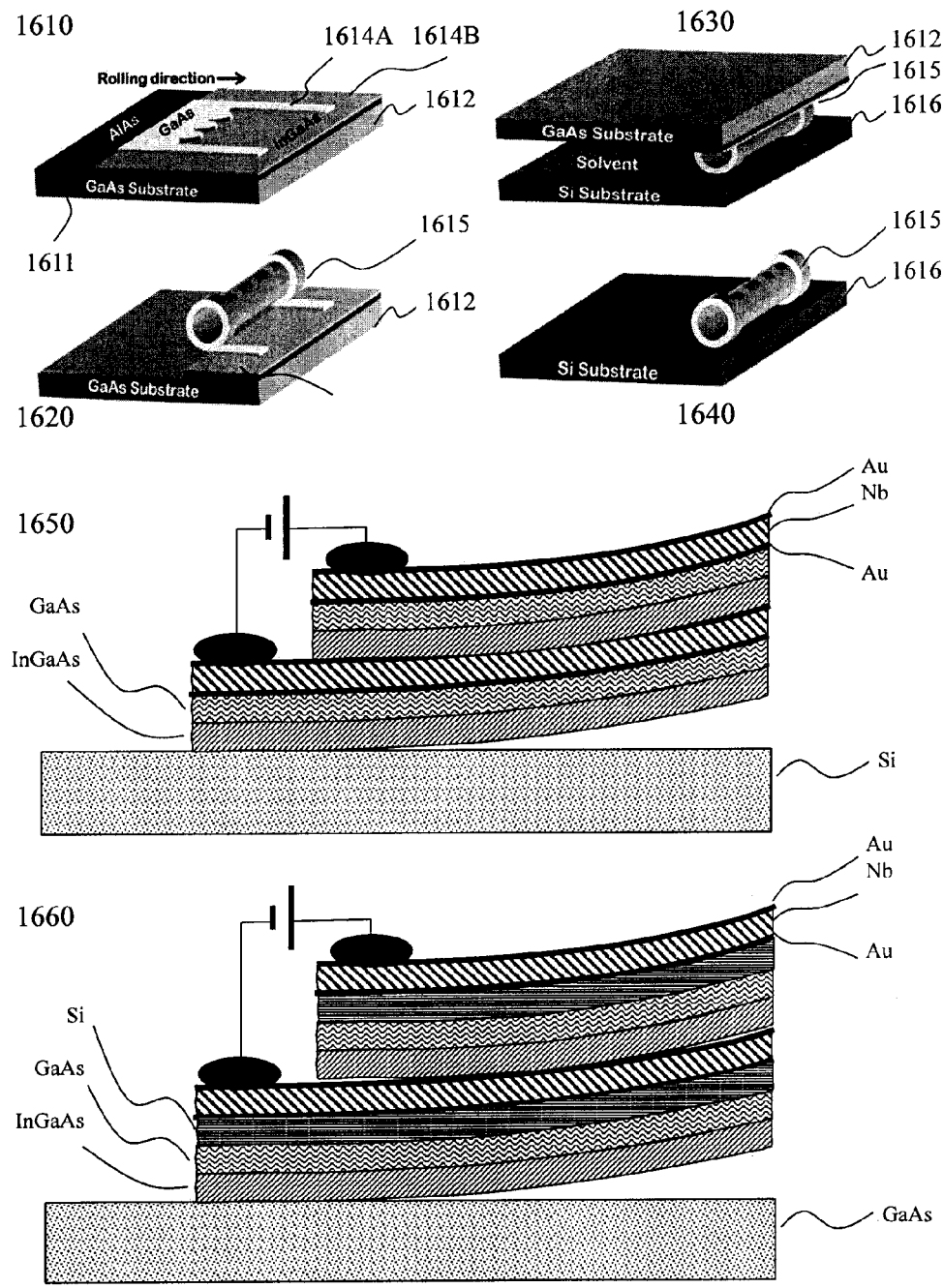
FIG. 16 depicts a nanotube manufacturing methodology and exemplary layer structures nanotubes integrable with solid state cooling methodologies according to embodiments of the invention.

Now referring to FIG. 16 there is depicted a transfer method for semiconductor nanotubes. Pseudomorphic InGaAs/GaAs quantum dot heterostructures were grown on GaAs substrates, which consist of a 50 nm AlAs sacrificial layer 1611 and 20 nm In0.18Ga0.82As 1614B and 30 nm GaAs layers 1614A. Two In0.5Ga0.5As quantum dot layers were embedded in the GaAs matrix, not shown for clarity. The use of quantum dots can substantially reduce nonradiative recombination associated with the presence of surface defects, due to the three dimensional localization of carriers in the dots. As shown in pre-etch schematic 1610 a strained U-shaped mesa was first defined by etching the GaAs 1614A to the InGaAs layer 1614B. The AlAs sacrificial layer 1611 was also etched through at the starting edge of the rolled-up semiconductor tube. The self-rolling process was initiated with the selective etching of the AlAs sacrificial layer 1611 using hydrofluoric acid based solutions due to the relaxation of strain in the InGaAs/GaAs bilayer. After a certain distance, the middle part of the tube is separated from the substrate and as a result, continuous rolling on the side pieces leads to freestanding semiconductor tubes 1615 on GaAs substrate 1612 as illustrated in pre-release schematic 1620. It may be noted that the presence of a sinusoid corrugation at the inner edge of the mesa results in semiconductor tube ring resonators with an engineered geometry as will be discussed below.

To achieve semiconductor tube ring resonators employing semiconductor tubes 1615 on Si substrate 1616, the thin AlAs sacrificial layer underlying the mesa is completely etched and the fully released quantum dot semiconductor tubes 1615 are then registered on the GaAs substrate 1613. Subsequently, as shown in transfer schematic 1630 the GaAs substrate 1613 is placed directly on top of the Si substrate 1616 with the presence of an appropriate solvent. When the GaAs substrate 1613 is removed, freestanding semiconductor tubes 1615 preferentially stay on the Si substrate 1616 due to the gravitational force induced by the solvent in and around the tube. Upon drying out the solvent the semiconductor tubes 1615 are attached to the Si wafer 1616 by van der Waals bonding as shown in final schematic 1640.

Referring to first and second cross-sections 1650 and 1660 respectively structures for semiconductor nanotubes are depicted comprising Au:Nb:Au:GaAs:InGaAs and Au:Nb:Au:Si:GaAs:InGaAs respectively upon Si and GaAs substrates respectively. According to embodiments of the invention the semiconductor layers within each of the semiconductor nanotubes as well as the substrates may form solid state cooling structures depending upon whether they are doped, therefore exploiting dopant donor spin cooling, or undoped and therefore defect donor spin cooling. It would be evident that in first and second cross-sections 1650 and 1660 electrical properties of the nanotubes may be impacted by the niobium layers in addition to the cryogenic properties of the semiconductor layers. According to other embodiments of the invention nanotubes may be fabricating exploiting solid state cooling according to embodiments of the invention without the introduction of superconducting and/or additional semiconductor materials within the nanotube structure. Hence in the instance presented supra the nanotube may be formed solely from InGaAs/GaAs and provide solid state cooling itself together with that provided from the whole substrate or a localized portion of the substrate.

Figure 17:
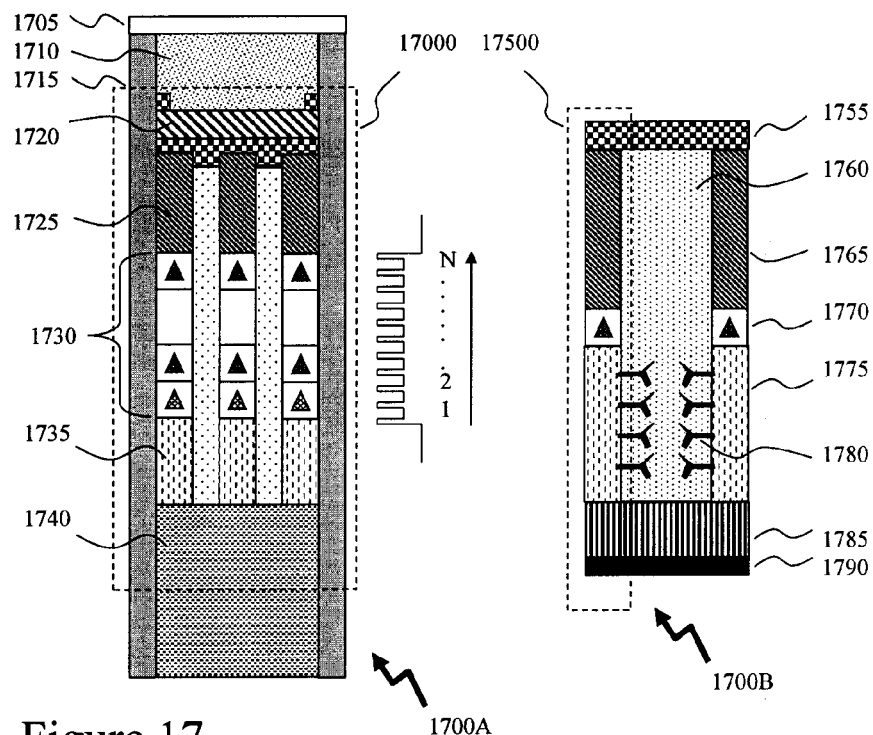
FIG. 17 schematics of photoelectrochemical device and electrobiological device respectively according to embodiments of the invention exploiting dot-in-a-wire structures

Now referring to FIG. 17 there are depicted schematics of photoelectrochemical device 1700A and electrobiological device 1700B respectively according to embodiments of the invention exploiting dot-in-a-wire structures. Considering initially photoelectrochemical device 1700A then a photovoltaic hydrogen/oxygen generator is depicted. The photoelectrochemical device 1700A exploiting a self-organized InGaN/GaN dot-in-a-wire photovoltaic structure 17000 that has been grown on a low resistivity n-type Si(111) substrate 1740. N-type Si doped GaN 1735 is formed atop this followed by vertically stacked array 1730 of quantum dot heterostructures, and p-type Mg doped GaN 1725. Atop this structure once planarized upper contacts, for example Ni/Au, that are separated by an ITO layer, ITO being electronically conductive and optically transparent. The bottom contact to the low resistivity n-type Si(111) substrate 1740 being Ti/Au, for example.

The self-organized InGaN/GaN dot-in-a-wire photovoltaic structure 17000 is then disposed within a housing 1715 having a transparent window 1705. Adjacent the upper ITO layer is disposed electrolyte 1710. Accordingly, optical illumination of the photoelectrochemical device 1700A through the transparent window 1705, i.e. by solar radiation, results in the self-organized InGaN/GaN dot-in-a-wire photovoltaic structure 17000 generating a potential across the device such that the ITO layer and bottom layer are electrically charged such that electrochemical reaction occurs in the electrolyte 1710 such that for example hydrogen is generated. By suitable ancillary equipment around the photoelectrochemical device 1700A these released gases can be collected and used for energy generation. In some instances the self-organized InGaN/GaN dot-in-a-wire diode 17500 may be optically emissive and the presence of the biomolecule or other molecule being sensed may above a specific concentration or threshold result in the electrical characteristic being shifted sufficiently either to result in the optical emitter turning on or turning off. Alternatively the receptors 1780 may be disposed upon the p-type Mg doped GaN 1765 or in some instances the quantum dot 1770. Accordingly by varying the receptors 1780 across an area of the n-type Si(111) substrate 1785 and partitioning one or both of the upper contacts 1755 and bottom contact 1790 a compact, high sensitivity, high efficiency assay device may be provided.

In each instance photoelectrochemical device 1700A and electrobiological device 1700B exploit a variety of semiconductor materials in addition to be being grown upon substrates which have been omitted for clarity in the descriptions with respect to each device. Accordingly, dependent upon their particular properties, one or more semiconductor materials including but not limited to the substrate may support solid state cooling according to embodiments of the invention.

Figure 18:
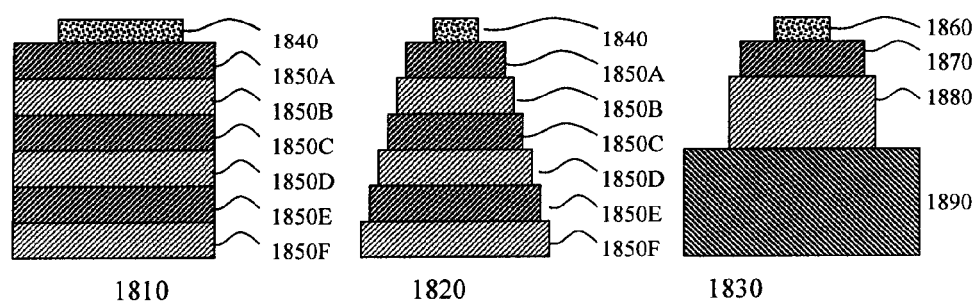
FIG. 18 depicts stacked solid state cooler configurations according to embodiments of the invention.

Referring to FIG. 18 there are depicted first to third stacked assemblies 1810 to 1830 respectively according to embodiments of the invention for providing increased solid state cooling to a substrate or device. First and second stacked assemblies 1810 and 1820 respectively comprise device 1840 sitting atop a stack of first to sixth cooler substrates 1850A through 1850F respectively, but where in second stacked assembly 1820 the first to sixth cooler substrates 1850A through 1850F respectively increase in dimensions away from the device 1840. According to embodiments of the invention first to sixth cooler substrates 1850A through 1850F respectively may be the same substrate, e.g. silicon, or may be different substrates or different combinations of substrates which may vary in at least one of material composition, doping, doping profile, doping pattern, geometry for example. Third stacked assembly 1830 depicts a variant wherein a device 1860 sits atop first to third cooling elements 1870 to 1890 respectively which as with the first and second stacked assemblies 1810 and 1820 may vary in at least one of material composition, doping, doping profile, doping pattern, geometry for example but also vary in thickness. In each of the first to third stacked assemblies 1810 to 1830 respectively the different substrates may be bonded by one or more techniques including, but not limited to, direct bonding plasma activated bonding, anodic bonding, eutectic bonding, glass fit bonding, adhesive bonding, thermocompression bonding, and reactive bonding Accordingly it would be evident that solid state coolers may be designed with different operating regimes, temperature offsets, magnetic field ranges, etc. Also in each of the first to third stacked assemblies 1810 to 1830 respectively the different substrates may be prepared by semiconductor growth and processing techniques including, but not limited to, molecular beam epitaxy, metal-organic chemical vapour deposition, chemical beam epitaxy, thermal evaporation, electron beam evaporation, atomic layer deposition, Czochralski growth, float-zone growth/refinement, ion implantation and thermal annealing.

It would be evident that in instances where the substrate, portion of the substrate, nanowire, MEMS device, or other structure being cooled generates heat, i.e. absorbs energy (i.e. photodetector) or dissipates power (e.g. electronics) that the solid state cooling provided by embodiments of the invention through adiabatic demagnetization will in many instances be insufficient and accordingly a refrigeration cycle, analogous to the Carnot cycle, could be implemented. A typical process flow being depicted in FIG. 19A wherein the solid state cooler is initially subject to an increasing magnetic flux density in step 1910 wherein the dipoles within the solid state cooler align, thereby decreasing the solid state cooler's magnetic entropy and heat capacity, but as the total entropy is not reduced solid state cooler $T_f = T_o + \Delta T_{AD}$. Next in step 1915 in isomagnetic enthalpic transfer the added heat is removed through a heatsink with the magnetic field held constant to prevent the dipoles from reabsorbing the heat.

Once sufficiently cooled, the solid state cooler and heatsink are separated in step 1920 wherein in step 1925 the magnetic field is decreased and adiabatic demagnetization undergone wherein an adiabatic temperature reduction occurs as the thermal entropy is transferred to magnetic entropy (disorder of the dipoles). Next in step 1930 isomagnetic entropic transfer is initiated by keeping the magnetic field constant and the solid state cooler is placed into thermal contact with the device being cooled. Because the solid state cooler is now at a lower temperature than the solid state cooler is cooler than the device heat energy flows into the solid state cooler. Subsequently the device and solid state cooler are separated again and the process loops based upon a decision in step 1940 if cooling is still required or terminates if not. In some instances a single cooling cycle may be sufficient whilst in others the cycle may repeat continuously.

Figure 19A:
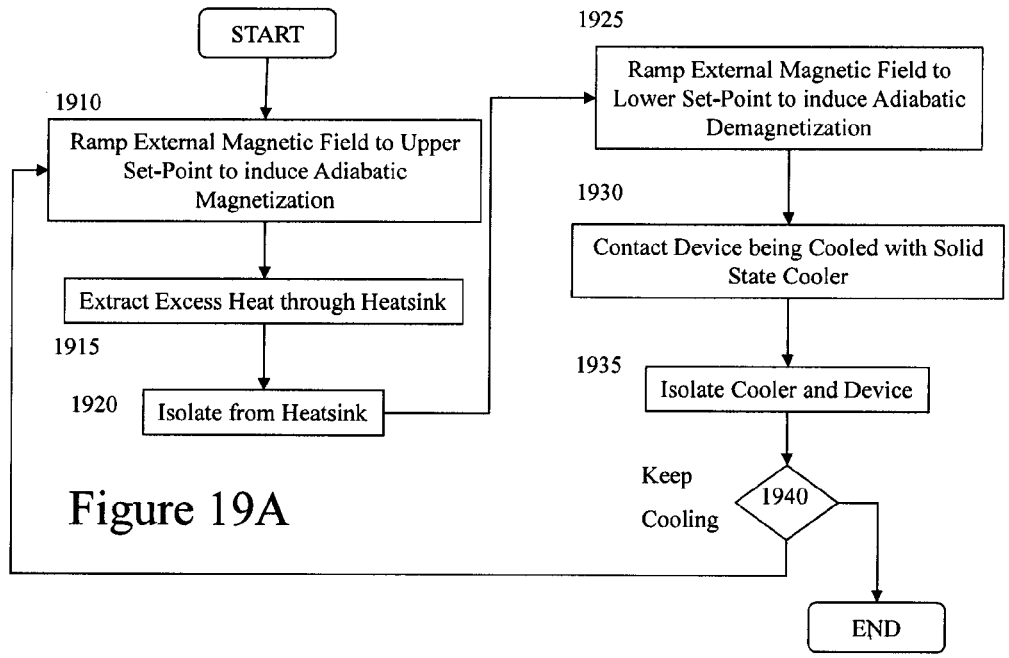
FIG. 19A depicts an exemplary process flow for a solid state cooling cycle according to an embodiment of the invention.
Figure 19B:
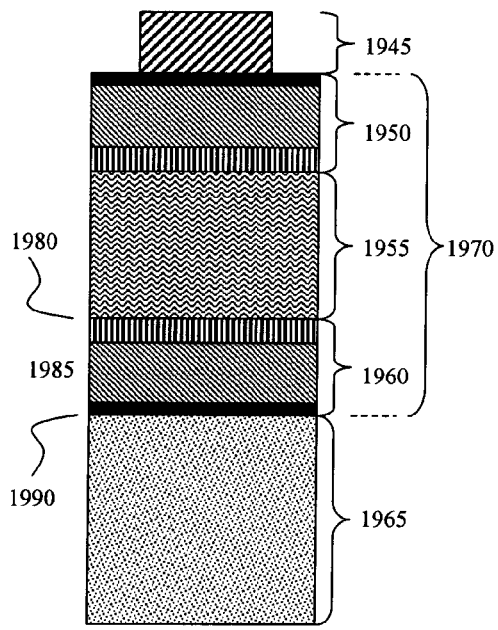
FIGS. 19B and 19C depict exemplary electrical structures for thermally isolating a solid state cooler according to embodiments of the invention allowing a cooling cycle such as depicted in FIG. 19A to be implemented with electrical control of the solid state cooler and magnetic field.

It would be evident that within the process flow presented in respect of FIG. 19A the solid state cooler, device, and heatsink are interconnected thermally in a predetermined sequence in order to execute the solid state cooling cycle according to an embodiment of the invention. Within the prior art for paramagnetic salts such interconnections have been performed through mechanical action(s). However, for cryogenic electronics it would be preferable for the interconnection of elements to be performed electrically. The thermal properties of a semiconductor material are like the electrical properties dependent upon factors such as doping and the presence/absence of carriers. Accordingly referring to FIG. 19B a solid state cooler 1970 is depicted between a heatsink 1965 and device 1945 to be cooled. Solid state cooler 1970 comprising first and second MOS depletion elements 1950 and 1960 respectively disposed on either side of substrate 1955. Each of the first and second MOS depletion elements 1950 and 1960 respectively comprising a first contact 1980, doped region 1985 and second contact 1990.

If, for example doped region 1985 is p-type silicon, then if a positive voltage is applied to first contact 1980 some of positively charged holes in the semiconductor nearest the first contact 1980 are repelled by the positive charge on the first contact 1980, and exit the MOS depletion element through the second contact 1990 resulting in a depleted region wherein no mobile holes remain leaving the immobile, negatively charged acceptor impurities. If the first contact 1980 is polysilicon of opposite type to the doped region 1985 then a spontaneous depletion region forms if the first contact 1980 is electrically shorted to the doped region 1985, in much the same manner as for a pn-junction. Accordingly under electrical control depletion regions may be formed within the solid state cooler 1970 adjusting the thermal properties of the respective regions such that though controlled electrical signaling to the first contacts 1980 within the first and second MOS depletion elements 1950 and 1960 respectively the device 1945, solid state cooler 1970, and heatsink 1965 may be interconnected in the desired sequence in combination with the required magnetic field sequence.

As depicted device 1945 may be an active semiconductor device formed upon a substrate that has been processed to provide the required contacts and doped regions in addition to the doping region within the substrate for adiabatic demagnetization based cooling. It would be evident that other electrically controlled structures providing modified thermal properties may be implemented including, but not limited to, the alternate geometry depicted in FIG. 19C wherein a MOSFET 19300 is formed within a substrate 19400 prior to planarization with planarizing material 19200 and formation of a device structure 19100, e.g. a TES detectors, JJ, SQUID, or nanowire for example.

It would be evident to one skilled in the art that within the embodiments of the invention presented in respect of FIGS. 1 through 19C that semiconductor based solid state cooling has been presented with respect to adiabatic demagnetization of spins arising from dopant donors and/or defects within Si primarily but that solid state semiconductor cooling may also be implemented within other semiconductors including, but not limited to, Si, Ge, SiGe, InAs, GaAs, InGaAs, AlAs, GaN, InGaN, InSb, and InP. It would be evident to one skilled in the art that other semiconductors may provide solid state cooling according to embodiments of the invention based upon adiabatic demagnetization under appropriate material parameters including but not limited to, intrinsic and extrinsic semiconductors, silicon carbide, organic semiconductors, group IV elemental semiconductors, III-V semiconductors, II-VI semiconductors, I-VII semiconductors, IV-VI semiconductors, V-VI semiconductors, II-V semiconductors, and magnetic semiconductors.

In addition to the different families of semiconductors and specific materials identified above supporting semiconductor based solid state cooling via adiabatic demagnetization of spins arising from dopant donors and/or defects the semiconductor based solid state cooling may be obtained in semiconductor structures including, but not limited to, bulk semiconductors, doped semiconductors, undoped semiconductors, intrinsic semiconductors, semiconductor heterostructures, quantum wells, nanowires, quantum dots, quantum dots within quantum dots and/or wells, and combinations thereof.

5. Nuclear Spin Semiconductor Based Solid State Cooling

In addition to possessing electron spin the semiconductors described and referred to supra also possess "nuclear spin" associated with the semiconductor atoms, such as $^{29}$Si in silicon and $^{69}$Ga and $^{75}$As in GaAs for example. Correspondingly these "nuclear spins" may be similarly brought from a low entropy state to a higher entropy state, with each nuclear spin flip into an excited state taking energy from the semiconductor lattice to produce an overall cooling. Accordingly, demagnetization of the nuclear spin may be similarly employed to adiabatically cool a semiconductor in a manner similar to that with electron spin. This nuclear spin adiabatic cooling may be employed discretely, concurrently with electron spin adiabatic cooling, or sequentially with electron spin adiabatic cooling by exploiting a demagnetization field.

It would be evident to one skilled in the art that semiconductor structures may be fabricated in which position and concentration of nuclear spins can be controlled intentionally, see for example "Isotopically Engineered Semiconductors—New Media for the Investigation of Nuclear Spin Related Effects in Solids" (Physica E, Vol. 10, pp 463-466). It would also be evident to one skilled in the art that within semiconductor heterostructures nanometer-scale polarization profiles may be achieved for nuclear spin and that it is possible to control the local interactions between electronic and nuclear spin with an applied voltage, see for example Poggio et al in "Nuclear and Ion Spins in Semiconductor Nanostructures" (Physica E, Vol. 35, pp 264-271). Accordingly localized and controlled cooling of semiconductors exploiting nuclear spin adiabatic demagnetization may be engineered within semiconductor devices with or without electron spin adiabatic demagnetization solid state cooling.

6. Continuous Cycle Magnetic Semiconductor Solid State Cooling

There are three magnetic moments associated with an electron, one from its spin angular momentum, one from its orbital angular momentum, and one from its total angular momentum (the quantum-mechanical sum of those two components). Corresponding to these three moments are three different g-factors, namely the electron spin g-factor, $g_e$, the electron orbital g-factor, $g_L$, and the Landé g-factor, $g_J$, which is defined by Equation (17) below where μ is the total magnetic moment resulting from both spin and orbital angular momentum of an electron, J=L+S is its total angular momentum, and $\mu_B$ is the Bohr magneton.

$$\mu = \frac{g_J \mu_B}{\hbar} J \qquad (17)$$

Figure 20:
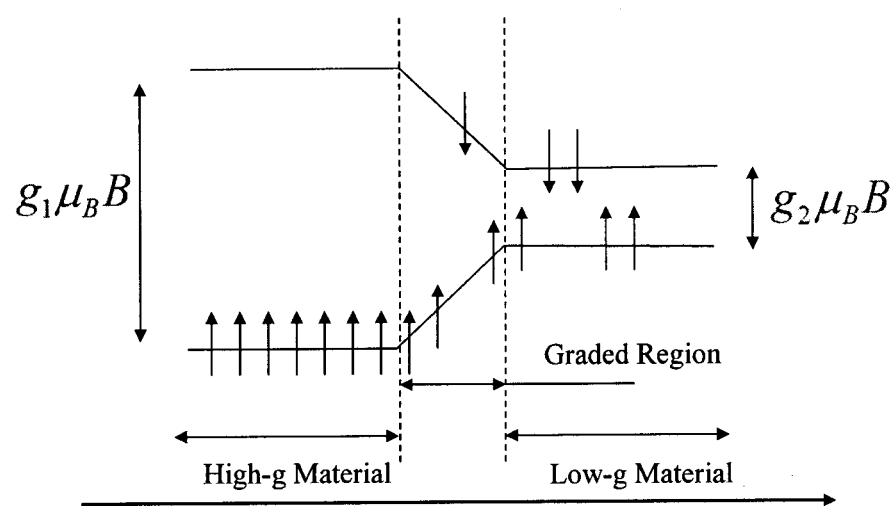
FIG. 20 depicts a schematic of the Zeeman energy in a heterostructure along the growth direction for continuous solid state cooling according to an embodiment of the invention.

Referring to FIG. 20 there is depicted a schematic of the Zeeman energy in a heterostructure along the growth direction, z, for a semiconductor structure consisting of a first semiconductor material with a high g-factor, $g_1$, at one side of the structure and a second semiconductor material with a low g-factor, $g_2<g_1$, at the other side and a graded region in between. If electrons are made to flow from the first semiconductor material to the second semiconductor material in the presence of a magnetic field B such that $g_1\mu_B B > k_B T$, $g_2\mu_B B < k_B T$, and the bias voltage $V_{DS} < (k_B T)/e$ then the spin polarized electrons in the first semiconductor material are depolarized as they flow into the second semiconductor material. In doing so entropy, $k_B$ ln 2 per electron, and heat, $g_{eff}\mu_B B$ per electron is taken up continuously by the electrons flowing from the first semiconductor material to the second semiconductor material, where $g_{eff}$ is the average g-factor where the electrons spin-flip within the transition region.

Accordingly, continuous magnetic refrigeration is provided within a semiconductor/metal heterostructure with a spatially varying Landé g-factor, in the presence of a magnetic field and an electrical current supplied at an appropriate bias voltage. The semiconductor heterostructures can be operated either as a solid state refrigerant in contact with the material to be cooled, or as a solid state refrigerant monolithically integrated into a device, circuit or system. In both cases, magnetic refrigeration proceeds by pumping entropy from the matter to be refrigerated into the spin entropy of a continuously flowing electrical current that is initially spin polarized. Heat is extracted from the material to be refrigerated by electron spin flips in the constituent current, each spin flip extracting $\Delta E = g\mu_B B$ of thermal energy, where B is a constant bias magnetic field that may for example be applied by means of a magnet.

Heat extraction will proceed if $\Delta E = g_2 \delta_B B$ is less than or of the order of the thermal energy $k_B T$. The bias voltage $V_{DS}$ used to impart current flow should be established such that the Joule heating per electron $eV_{DS}$ is less than the spin flip energy $\Delta E = g_{eff}\mu_B B$, where $g_{eff}$ is the average g-factor at which spin flips occur. If spin flips occur primarily within the second semiconductor material, $g_{eff} = g_2$, and consequently the bias voltage $V_{DS}$ must be less than the thermal voltage $(k_B T)/e$. The maximum heat that can be pumped per unit time by the semiconductor solid state refrigerator is the product of electron flow rate and Zeeman energy, i.e. $(I/e) \times g\mu_B B$.

It would be evident to one skilled in the art that it is known that the Landé g-factor for conduction band electrons can be engineered in semiconductors and semiconductor heterostructures, see for example Kosaka et al. in "Electron g-factor Engineering in III-V Semiconductors for Quantum Communications" (Elect. Lett., Vol. 47, pp 464-465). Accordingly, epitaxial semiconductor and/or metal growth techniques can be used to precisely tune the g-factor profile to effect the desired effective demagnetization that electrons experience in moving from the high-g first semiconductor material to the low-g second semiconductor material. Accordingly various g-factor profiles may be implemented and employed including, but not limited to, abrupt and graded heterostructure interfaces between high-g and low-g semiconductors and/or metals. Whilst the discussion supra is in respect of electrons it would be apparent to one skilled in the art that the equivalent effect may be achieved through spatially varying Landé g-factor for holes and a corresponding hole flow within the semiconductor and/or metal heterostructure.

7. Spatial Magnetic Spatial Solid State Cooling

Within the preceding descriptions of magnetic cooling through spin depolarization the discussions and embodiments of the invention have been primarily described from the perspective of providing to a predetermined region of a semiconductor structure a time varying magnetic field from a magnetic field generator spatially fixed with respect to the predetermined region of a semiconductor structure. However, it would evident that alternatively the movement of spin from a region of high magnetic field, where spins are in a highly polarized low entropy state, to a region of low magnetic field, where spins are in a low polarized high entropy state, can also be used to effect solid state cooling according to embodiments of the invention.

Accordingly, it would be evident that the source of magnetic field may be of an arbitrary shape provided that it results in the generation of suitable field gradient in space and time. As such the magnetic fields required for spin cooling may be generated by a variety of different means, including but not limited to, permanent magnets, internal magnetic fields, DC electromagnets, pulsed electromagnets, and superconducting electromagnets for dissipationless generation of magnetic field. Further, it would be evident that many techniques for moving magnets may be applied in combination with static or time-varying dynamic magnetic fields to provide the required (suitable) field gradient in space and time.

For example, it would possible to integrate within a semiconductor structure a microelectromechanical system (MEMS) element or elements such as, for example, an electrostatic actuated element, e.g. comb drives, gear, etc; resonators, e.g. clamped beams, free beams, plate resonators, etc; together with electrical structures such as coils and electrodes for example and thin film deposited rare earth magnets, such as for example those based upon Gd, Tb, Dy, and Nd rare earths in conjunction with Ti, V, Cr, Mn, Fe, Co, Ni, and Cu transition metals as reported by Yamashita et al in "Thin Film Rare Earth Permanent Magnet, and Method for Manufacturing the Permanent Magnet" (European Patent 1,329,912). Accordingly, spatially varying magnetic fields may be applied with simple characteristics, e.g. sinusoidal with a resonant structure or linear with comb drive, or complex characteristics, e.g. a comb drive with sawtooth or other complex drive signal or an eccentric gear train.

Figure 19C:
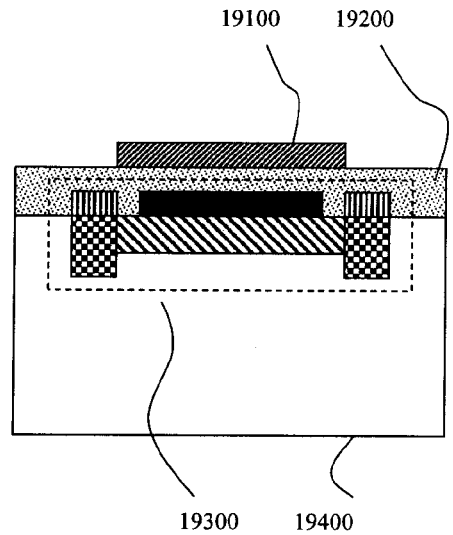

Such structures may further be integrated with CMOS electronic such as that described supra in respect of FIG. 19C wherein a MOSFET 19300 is formed within a substrate 19400 prior to planarization with planarizing material 19200 and formation of a device structure 19100, e.g. a TES detectors, JJ, SQUID, or nanowire for example, undertaken atop the MOSFET. Accordingly, the MEMS structures may provide for spatially and temporally varying magnetic fields whilst the MOSFET 19300 through varying carrier density when operating in depletion mode results in electrically controlled thermal contact between the device structure 19100 and substrate 19400 such that the thermal contact can be "broken" by depleting the MOSFET.

The spins yielding magnetic cooling may be carried by electrons, holes or both species of charge carrier simultaneously. Refrigeration by a spin current can be thought of as Peltier cooling via spin entropy, or spin Peltier cooling. Magnetic refrigeration techniques can be effected through a number of variations as the spin polarization is determined by the product of magnetic field and Landé g-factor. Accordingly, spin cooling may therefore be effected not only by the temporal and/or spatial variation of an applied magnetic field, but also by the spatial and/or temporal variations of Landé g-factor. Similarly, spin polarisation based magnetic cooling may be effected by any simultaneous temporal and spatial variation of magnetic field and Landé g-factor where the net effect is to produce a spin depolarization. Generalized spin cooling techniques may be implemented, for example, by any combination of pulsed magnetic fields and arbitrarily shaped magnetic fields.

8. Multiple Stage and Last Stage Magnetic Solid State Cooling

Within the preceding descriptions of magnetic cooling through spin depolarization the discussions and embodiments of the invention have been primarily described from the perspective of a discrete magnetically cooled semiconductor structure. However, spin cooling structures (or stages) may also be combined and/or integrated together with other spin cooling structures/stages to increase the operating range of the magnetic cooling based refrigerator. For example, several spin cooling stages may be integrated in a single substrate or in several thermally linked substrates to widen the operating temperature range of spin cooling.

Similarly, spin cooling structures may also be combined and/or integrated together with other refrigeration techniques to widen the operating temperature range of the composite refrigerator. For example, single stage or multistage thermoelectric (Peltier) cooling may be used to bring substrate temperature to within the operating temperature range of a spin cooling stage. Alternatively, other prior art cooling techniques such as those based upon vapour-compression, vapour-absorption, gas cycles, Sterling cycles, dilution refrigerators, and cryocoolers may be used in conjunction with spin cooling to provide a wider operating temperature range of the overall refrigerator whilst achieving the very low temperatures possible through spin cooling or other temperature ranges as spin based cooling is applied to other materials.

Within descriptions of embodiments of the invention reference has been made to particular semiconductors and superconductors. However it would be evident to one skilled in the art that a variety of structures including but not limited to nanowires, quantum dots, quantum wells, nanotubes, nanorods, fullerenes, and molecular nanowires may exhibit properties that benefit from operation at low temperatures including but not limited to thermal noise and band delineation.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method comprising:
    (a) providing a device comprising at least a semiconductor material comprising spins at a predetermined density within a magnetic field;
    (b) cycling the magnetic field from a first predetermined value to a second predetermined value at a first predetermined rate to establish a first condition for a predetermined portion of the spins;
    (c) extracting thermal energy generated within the semiconductor material through step (b);
    (d) increasing a thermal isolation of the semiconductor material to its surroundings; and
    (e) cycling the magnetic field from a third predetermined value to a fourth predetermined value at a second predetermined rate to establish a second condition for a predetermined portion of the spins.

2. The method according to claim 1 wherein,
    the spins are at least one:
        bound to donor impurity atoms within the semiconductor material;
        bound to defects within the semiconductor material;
        electron spins; and
        nuclear spins.

3. The method according to claim 1 wherein,
    cycling varying the magnetic field comprises at least one of spatially and temporally varying the magnetic field.

4. The method according to claim 1 wherein,
    step (e) results in at least one of cooling and adiabatic demagnetization of the semiconductor material.

5. The method according to claim 1 wherein,
    the semiconductor material is at least one of the substrate for the device, a predetermined portion of a passive device forming a predetermined portion of the semiconductor device, and a predetermined portion of an active device forming a predetermined portion of the semiconductor device.

6. The method according to claim 1 wherein,
    the semiconductor material is silicon.

7. The method according to claim 1 wherein,
    step (d) comprises at least one of physically isolating the device from another element and electrically controlling a predetermined electronic element forming a predetermined portion of the device.

8. The method according to claim 1 wherein,
    the device is at least one of a semiconductive device and a superconductive device in operation.

9. A device comprising:
    a substrate comprising a first semiconductor material;
    an element comprising a second semiconductor material comprising spins at a predetermined density;
    an electrically adjustable thermal barrier formed within the substrate between the element and the substrate, wherein
    the second semiconductor material may be cooled in dependence upon executing a predetermined sequence of steps relating to the electrically adjustable thermal barrier and a variable magnetic field within which the device is located.

10. A device according to claim 9 wherein,
the predetermined sequence of steps comprises least:
(a) cycling the variable magnetic field from a first predetermined value to a second predetermined value at a first predetermined rate to establish a first condition for a predetermined portion of the spins with the electrically adjustable thermal barrier in a first predetermined state;
(b) extracting thermal energy generated within the semiconductor material through step (a);
(c) establishing the electrically adjustable thermal barrier in a first predetermined state; and
(d) cycling the variable magnetic field from a third predetermined value to a fourth predetermined value at a second predetermined rate to establish a second condition for a predetermined portion of the spins.

11. The device according to claim 9 wherein,
the spins are at least one:
bound to donor impurity atoms within the second semiconductor material;
bound to defects within the second semiconductor material;
electron spins; and
nuclear spins.

12. The device according to claim 10 wherein,
step (d) results in at least one of cooling of the second semiconductor material and adiabatic demagnetization of the second semiconductor material.

13. The device according to claim 9 wherein,
the second semiconductor material is a predetermined portion of at least one of a passive device and an active device, the at least one of forming a predetermined portion of the semiconductor device.

14. The device according to claim 9 wherein,
cycling varying the magnetic field comprises at least one of spatially and temporally varying the magnetic field.

15. A method comprising:
providing a semiconductor heterostructure comprising a spatially varying Landé g-factor from a first predetermined value to a second predetermined value;
applying a predetermined magnetic field to the semiconductor heterostructure;
biasing the semiconductor heterostructure at a voltage that is less than the thermal voltage of the semiconductor heterostructure; wherein
a resulting current flow within the semiconductor heterostructure results in continuous cooling of a side of the semiconductor heterostructure with the Landé g-factor with the first predetermined value.

16. The method according to claim 15 wherein,
the Landé g-factor and current flow relate to at least one of electrons and holes.

17. The method according to claim 15 wherein,
the semiconductor heterostructure comprises a predetermined portion of at least one of a semiconductor substrate and a semiconductor circuit.

18. A device comprising:
a semiconductor heterostructure comprising a spatially varying Land& g-factor from a first predetermined value to a second predetermined value;
a circuit applying a bias to the semiconductor heterostructure at a voltage that is less than the thermal voltage of the semiconductor heterostructure; wherein
a resulting current flow within the semiconductor heterostructure when a predetermined magnetic field is applied results in continuous cooling of a side of the semiconductor heterostructure with the Landé g-factor with the first predetermined value.

19. The device according to claim 18 wherein,
the Landé g-factor and current flow relate to at least one of electrons and holes.

20. The device according to claim 18 wherein,
the semiconductor heterostructure comprises a predetermined portion of at least one of a semiconductor substrate and a semiconductor circuit.

* * * * *